United States Patent [19]
Sugano et al.

[11] Patent Number: 5,795,825
[45] Date of Patent: Aug. 18, 1998

[54] CONNECTION LAYER FORMING METHOD

[75] Inventors: Yukiyasu Sugano, Kanagawa; Junichi Sato, Tokyo, both of Japan

[73] Assignee: Sony Corporation, Tokyo, Japan

[21] Appl. No.: 627,511

[22] Filed: Apr. 8, 1996

Related U.S. Application Data

[63] Continuation of Ser. No. 389,990, Feb. 16, 1995, which is a continuation of Ser. No. 113,898, Aug. 31, 1993, abandoned.

[30] Foreign Application Priority Data

Aug. 31, 1992 [JP] Japan ................................ 4-255786
May 29, 1993 [JP] Japan ................................ 5-151481

[51] Int. Cl.$^6$ .................................................. H01L 21/465
[52] U.S. Cl. .......................... 438/690; 438/691; 438/694; 438/697; 438/700; 438/701; 438/702; 438/703; 438/706; 438/710; 438/712; 438/713; 438/717; 438/734
[58] Field of Search ........................ 156/644.1, 645.1, 156/662.1, 657.1; 437/190, 192, 194, 195, 203, 225, 228; 204/192.17, 192.18, 192.21, 192.22, 192.23, 192.25, 192.26, 192.27, 192.28, 192.32, 192.37

[56] References Cited

U.S. PATENT DOCUMENTS

| | | | |
|---|---|---|---|
| 3,715,250 | 2/1973 | Altman et al. ........................ | 156/665 |
| 4,676,867 | 6/1987 | Elkins et al. ........................ | 437/228 |
| 4,789,648 | 12/1988 | Chow et al. ........................ | 437/225 |
| 4,842,678 | 6/1989 | Noro et al. ........................ | 156/636.1 |
| 4,954,214 | 9/1990 | Ho ........................ | 437/228 |
| 5,166,093 | 11/1992 | Grief ........................ | 437/228 |
| 5,171,412 | 12/1992 | Talieh et al. ........................ | 204/192.17 |
| 5,202,579 | 4/1993 | Fuji et al. ........................ | 257/751 |
| 5,244,837 | 9/1993 | Dennison ........................ | 437/195 |
| 5,305,519 | 4/1994 | Yamamoto et al. ........................ | 437/192 |

FOREIGN PATENT DOCUMENTS

| | | | |
|---|---|---|---|
| 4-326517 | 11/1992 | Japan ........................ | 437/225 |

*Primary Examiner*—R. Bruce Breneman
*Assistant Examiner*—Rodney G. McDonald
*Attorney, Agent, or Firm*—Hill, Steadman & Simpson

[57] ABSTRACT

A method of forming a connection layer by filling an Al-based material wherein planarization of an entire surface of a substrate is achieved. ① Al-based material 10 is deposited and filled in concave sections 4,8 formed in a substrate 1 under a high temperature, and then the surface of the Al-base material is polished with unwoven cloth or an etching liquid. ② In a lithography process using an alignment mark for alignment on a substrate, an Al-based material is deposited and filled in a concave section in a portion other than the alignment mark for alignment under a high temperature, and then the surface of the Al-based material is polished. ③ In a process to deposit an Al-based material on a substrate and then planarize the surface of the Al-based material by polishing, an antireflection film is deposited on the Al-based material after the Al-based material is planarized.

10 Claims, 34 Drawing Sheets ical technology for realization of the multilayered LSI as
CONNECTION LAYER FORMING METHOD This is a continuation of application Ser. No. 08/389,990, filed Feb. 16, 1995, which is a continuation of application Ser. No. 08/113,898, filed Aug. 31, 1993 now abandoned.

BACKGROUND OF THE INVENTION

1. Field of the Invention

The present invention relates to a method of forming a connection layer which is applied to production of semiconductor devices. The present invention can advantageously be applied to a case where a planarized Al multilayered connection layer is easily produced on the entire surface of a semiconductor wafer.

2. Related Art

A connection layer made of an AL-based material (pure Al, Al alloy, or other material containing these as the main components) used in LSI (hereinafter called Al connection layer) has been becoming more and more multilayered in association with increase in the integrity of LSI from 2-layered to 3-layered structures. Planarization is an essential technology for realization of the multilayered LSI as described above. It is necessary to carry out planarization to a contact hole as well as to a gap between connection layers. At present, planarization in a contact hole is carried out by filling Al or W therein. On the other hand, planarization in a gap between connection layers is carried out by planarizing an insulating film between the layers. As a method of planarizing an inter-layer insulating film, a method in which film deposition and etch back are combined, or in which a SOG film or a photo resist is used as a sacrificed layer for etchback is employed. However, with any type of planarizing method, a gap between a portion where a connection layer pattern exists and a portion where any connection layer pattern does not exist remains. The gap becomes larger as a number of layers increases. However, a depth of focus of a stepper used for photo resist pattern lithography is around ±0.5 μm, so that it is impossible to simultaneously carry out pattern lithography in the upper and lower sides of a gap. As described above, it is not always easy to planarize an entire surface so completely that no problems exist in pattern lithography. For instance, this problem can be explained as follows with a reference to an example of planarization of an insulating film between connection layers in which a conventional type of film deposition and etch back are combined as shown in FIGS. 1A to 1E.

(a) After an inter-layer insulating film SiO₂ ① 2 is deposited to the thickness of 500 nm on a Si substrate 1, a contact hole 4 is opened, using a resist mask 3, by means of reactive ion etching (See FIG. 1A).

(b) A Ti film 3a is deposited by means of sputtering under the following conditions.

| Conditions | Flow rate of Ar | 100 SCCM |
|---|---|---|
| | Gas pressure | 0.5 Pa |
| | Wafer heated to | 150° C. |
| | Target power | 4 kW |
| | Ti film thickness | 0.1 μm |

Then, an Al—Si film 9 is deposited by sputtering under the following conditions.

| Conditions | Flow rate of Ar | 100 SCCM |
|---|---|---|
| | Gas pressure | 0.5 Pa |
| | Wafer heated to | 500° C. |
| | Target power | 22.5 kW |
| | Al film thickness | 0.6 μm |

With this operation, the construction as shown in FIG. 1B is formed.

(c) After patterning of the photo resist 7, Al 9 and Ti 3a are processed by means of ion etching under the following conditions.

| Conditions | Gas BCl₃/Cl₂ | 80/90 SCCM |
|---|---|---|
| | Pressure | 2 Pa |
| | Micro wave power | 1000 W |
| | RF bias power | 50 W |

With this operation, the construction as shown in FIG. 1C is obtained.

(d) An inter-layer insulating film SiO₂ ② 11 is deposited (See FIG. 1D). This operation is carried out according to the following procedure. At first a plasma CVD SiO₂ film is deposited under the following conditions.

| Conditions | Gas TEOS/O₂ | 350/350 SCCM |
|---|---|---|
| | Pressure | 1.33 Pa |
| | Wafer heated to | 390° C. |
| | RF bias power | 350 W |
| | SiO₂ film thickness | 100 nm |

Then, a heat CVD SiO₂ is deposited under the following conditions.

| Conditions | Gas TEOS/O₂ | 1000/2000 SCCM |
|---|---|---|
| | Pressure | 12 kPa |
| | Wafer heated to | 390° C. |
| | SiO₂ film thickness | 450 nm |

Then, etching is carried out for planarization under the following conditions.

| Conditions | Gas CF₄/O₂ | 100/8 SCCM |
|---|---|---|
| | Pressure | 40 Pa |
| | Magnetron RIE, etching rate | 450 nm |

Then, a plasma CVD SiO₂ is deposited under the following conditions.

| Conditions | Gas TEOS/O₂ | 350/350 SCCM |
|---|---|---|
| | Pressure | 1.33 kPa |
| | Wafer heated to | 390° C. |
| | RF bias | 350 W |
| | SiO₂ film thickness | 100 nm |

(e) After a hole 8' is opened, a metal layer 10 (Al—Si ②), which is a second layer, is deposited. This operation is carried out according to the following procedure. At first, a Ti film 3b is deposited under the following conditions.

| Conditions | Flow rate of Ar | 100 SCCM |
| --- | --- | --- |
| | Gas pressure | 0.5 Pa |
| | Wafer heated to | 150° C. |
| | Target power | 4 kW |
| | Ti film thickness | 0.1 μm |

Then, as shown in FIG. 2F, an Al—Si film 11 is deposited by means of sputtering under the following conditions.

| Conditions | Flow rate of Ar | 100 SCCM |
| --- | --- | --- |
| | Gas pressure | 0.5 Pa |
| | Wafer heated to | 500° C. |
| | Target power | 22.5 kW |
| | Al film thickness | 0.8 μm |

By the way, in any of the processes described above, a gap corresponding to a difference in thickness of the Ti film 3a and the Si film 9, as shown in FIG. 1E each of which is the first layer, is generated between a left half where an Al connection layer exists and a right half where an Al connection layer does not exist. In the example described above, the gap is 0.7 μm. When the via hole 8' is opened in the SiO₂ film ② 11 or in the Al—Si film ② 10, a depth of focus of a stepper must be around 0.7 μm. In this case, it is possible to take a necessary measure, but after an Al connection layer, which is a second layer, is deposited, a depth of focus of 0.7+0.9=1.6 μm is required, and in this case it is impossible to take a necessary measure. Thus, in the prior art, a high degree of planarization in the entire surface of a substrate for patterning is extremely difficult.

SUMMARY OF THE INVENTION

In order to solve the technological problems as described above in the prior art, an object of the present invention is to provide a technology which enables a high degree of planarization in the entire surface of a substrate when forming a connection layer by filling an Al-based material therein.

An invention of claim 1 in the present patent application is a method of forming a connection layer comprising a step of depositing and filling an Al-based material in a concave section formed in a substrate under a high temperature and a step of polishing the surface to achieve the object as described above.

An invention of claim 2 in the present patent application is a method of forming a connection layer as claimed in claim 1 or claim 3, comprising a step of polishing with unwoven cloth to achieve the object as described above.

An invention of claim 3 in the present patent application is a method of forming a connection layer as claimed in claim 1 or claim 3, comprising a step of polishing with an etching liquid to achieve the object as described above.

An invention of claim 4 in the present patent application is a method comprising a step of depositing and filling an Al-based material in a concave section formed in a substrate under a high temperature, a step of polishing the surface, and a step of providing a polishing stopper layer.

An invention of claim 5 in the present patent application is a method of forming a connection layer, wherein a polishing stopper layer is made of the same material as that of an inter-layer film on the substrate to achieve the object as described above.

An invention of claim 6 in the present patent application is a method of forming a connection layer as claimed in claim 7, wherein a polishing stopper layer is made of a material which is different from that of an inter-layer film on the substrate to achieve the object as described above.

An invention of claim 7 in the present patent application is a method of forming a connection layer wherein a lithography process is carried out using an alignment mark for alignment on a substrate; comprising a step of depositing and filling an Al-based material in a concave section in a portion other than the alignment mark for alignment provided on the substrate, and a step of polishing the surface to achieve the object as described above.

An invention of claim 8 in the present patent application is a method of forming a connection layer as claimed in claim 1; comprising a step of filling a groove and a contact hole (all holes for connection including a contact hole and a via hole are generically called contact hole in the present invention) with an Al-based material, and a step of planarization by means of polishing to achieve the object as described above.

An invention of claim 9 in the present patent application is a method of forming a connection layer; comprising a step of filling a contact hole with an Al-based material, a step of planarization by polishing, a step of filling a groove corresponding to the connection layer with an Al-based material, and a step of planarization by polishing to achieve the object as described above.

An invention of claim 12 in the present patent application is a method of forming a connection layer comprising a step of forming a concave section (a groove and a contact hole corresponding to the connection layer, or a hole corresponding to any of them) in a planarized inter-layer film, a step of depositing and filling a film made of Al-based material therein, a step of planarizing the Al-based material covering a portion other than the concave section (such as a groove and a contact) by polishing, and a step of depositing a reflection preventing film on the Al-based material to achieve the object as described above.

An invention of claim 14 in the present patent application is a method of forming a connection layer as claimed in claim 10 wherein the aforesaid reflection preventing film is a conductive body; comprising a step of planarization leaving a gap on the Al-based material, a step of depositing an antireflection film in the entire surface, and a step of planarizing again and embedding the antireflection film to achieve the object as described above.

An invention of claim 16 in the present patent application is a method of forming a connection layer as claimed in claim 10 wherein the aforesaid reflection film is a conductive body; comprising a step of planarizing an Al-based material section, a step of depositing an antireflection film on the entire surface, and a step of processing the antireflection film according to a pattern of the Al-based material to achieve the object as described above.

An invention of claim 17 in the present patent application is a method of forming a connection layer as claimed in claim 10 wherein the aforesaid antireflection film is a non-conductive body and the non-conductive body is left, as it is, on the entire surface to achieve the object as described above.

An invention of claim 18 in the present patent invention is a method of forming a connection layer as claimed in claim 10, comprising a step of forming a barrier metal, a step of depositing an Al-based material, and a step of removing the Al-based material and the barrier metal in a portion other than a concave section (such as a groove or a contact hole) to achieve the object as described above.

A step of claim 19 in the present patent application is a method of forming a connection layer wherein an Al-based material flows into inside of all the concave sections (such as a groove or a contact hole) so that the Al-based material will not remain in a portion other than the groove and the contact hole when the Al-based material is deposited and the connection layer is formed through self-alignment to achieve the object as described above.

An invention of claim 20 in the present patent application is a method of forming a connection layer as claimed in claim 14, comprising a step of filling up a connection layer, and a step of depositing an insulating antireflection film under a low temperature; wherein the antireflection film is left on the entire surface so that the reflection preventing film will be used and generation of any failure (such as hillock or void) due to heat stress in the Al-based material will be suppressed, to achieve the object as described above.

In a preferable mode of implementing the present invention, a groove corresponding to a connection layer and a contact hole, or a concave section (hole) corresponding to any of them are provided in a planarized inter-layer insulating film, then a substrate is heated to more than 400° C. to deposit and fill an Al-based material including Al itself in the substrate, and then the Al-based material in a portion other than the groove and the hole is removed by means of polishing. The film made of the Al-based material to be planarized can be deposited by means of either a full growth or a selective growth CVD method. Preferably cloth used for polishing should be unwoven cloth made of polyurethane.

Using an etching liquid is preferable because use of granules for polishing is not required and contamination is not generated. This polishing liquid should preferably be any of an aqueous solution containing phosphoric acid (such as phosphoric acid, a mixture of phosphoric acid and nitric acid, a mixture of phosphoric acid, nitric acid, and an acetic acid), an aqueous solution containing H or NaOH, and an etching liquid for an aqueous solution containing ferric ions.

In another preferred mode of implementing the present invention, an alignment mark is exposed for lithography process by heating a substrate to more than 400° C. and polishing an Al-based connection layer deposited thereon for planarization.

In a different preferred mode of implementing the present invention, a groove corresponding to a connection layer and a contact hole, or a concave section (hole) corresponding to any of them are formed in a planarized inter-layer insulating film, an Al-based material including Al itself is deposited on and buried in a substrate, and a polishing stopper is formed in the groove section when the Al-based material in a portion other than the groove and the hole is planarized by means of polishing. In this mode, a material for this polishing stopper may be either the same as or different from that of the inter-layer insulating film.

In the present invention, a film made of an Al-based material is deposited and then planarized by means of polishing, and a planarization process, which was carried out to an inter-layer film in the prior art, is directly carried out to the Al-based material, so that the entire surface of a substrate can be planarized.

DETAILED DESCRIPTION OF THE PREFERRED EMBODIMENTS

Detailed description is made hereinafter for preferred embodiments of the present invention with reference to related drawings. It is needless to say that the present invention is not limited to the embodiments described below.

Embodiment 1

In the present embodiment, an Al film for Al connection layer is planarized by polishing to improve reliability of the connection layer. The processes in this embodiment are described below with reference to FIGS. 2A to 2F.

Figure 1A:
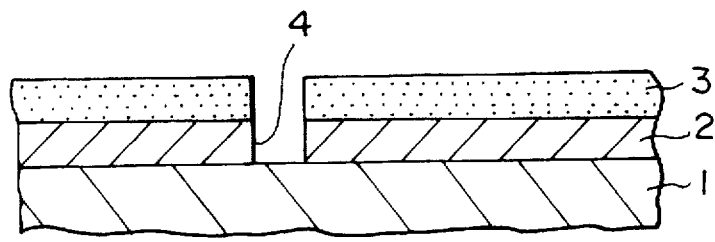
FIG. 1A is a cross sectional view illustrating a process sequence (1) in the prior art.
Figure 1B:
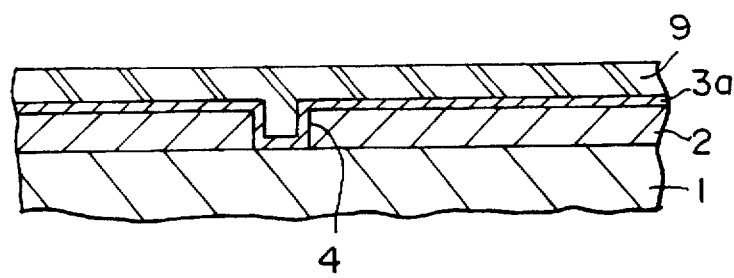
FIG. 1B is a cross sectional view illustrating a process sequence (2) in the prior art.
Figure 1C:
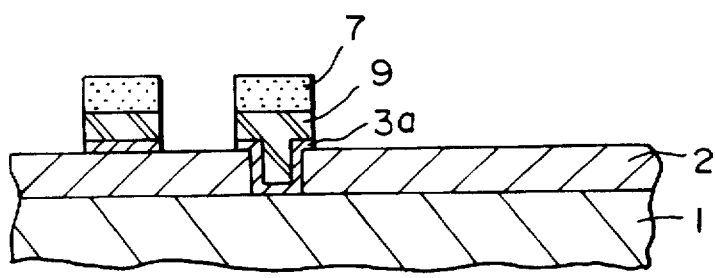
FIG. 1C is a cross sectional view illustrating a process sequence (3) in the prior art.
Figure 1D:
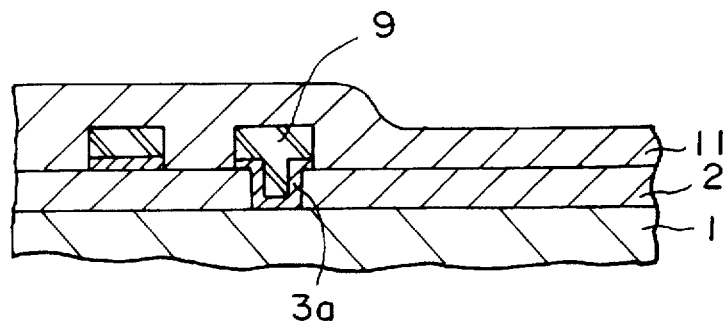
FIG. 1D is a cross sectional view illustrating a process sequence (4) in the prior art.
Figure 1E:
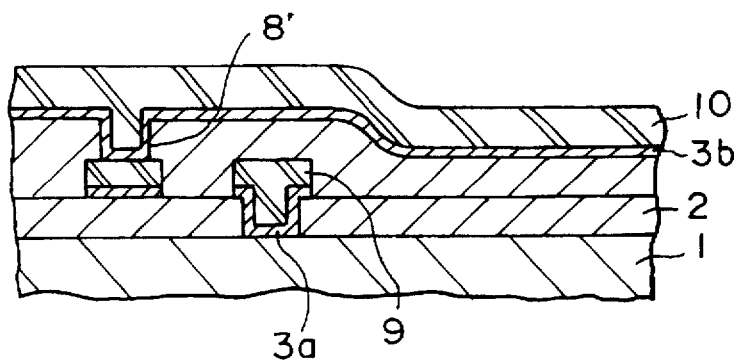
FIG. 1E is a cross sectional view illustrating a process sequence (5) in the prior art.
Figure 2A:
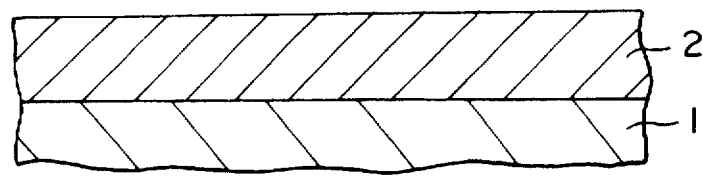
FIG. 2A is a cross sectional view illustrating a process sequence (1) in Embodiment 1.
Figure 2B:
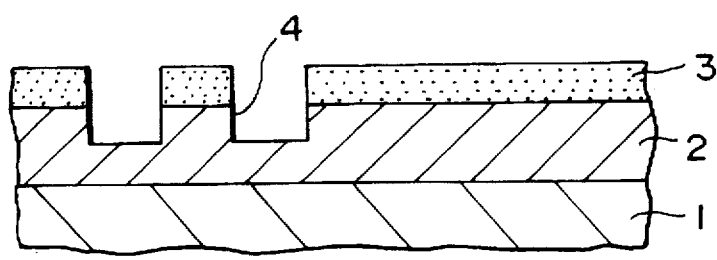
FIG. 2B is a cross sectional view illustrating a process sequence (2) in Embodiment 1.
Figure 2C:
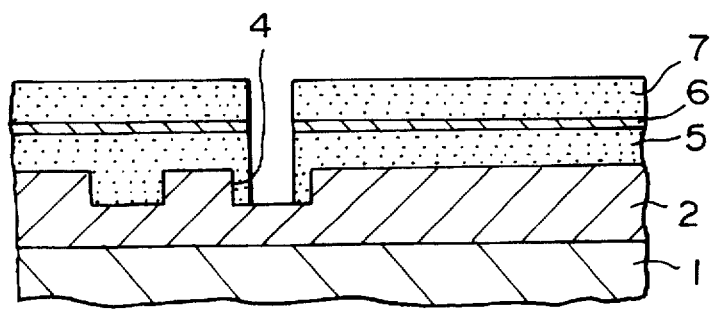
FIG. 2C is a cross sectional view illustrating a process sequence (3) in Embodiment 1.
Figure 2D:
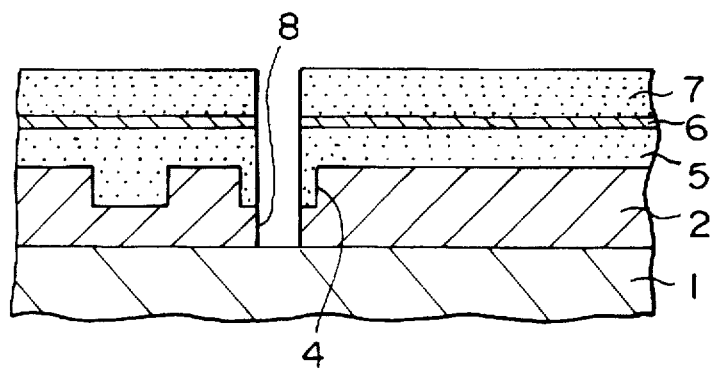
FIG. 2D is a cross sectional view illustrating a process sequence (4) in Embodiment 1.
Figure 2E:
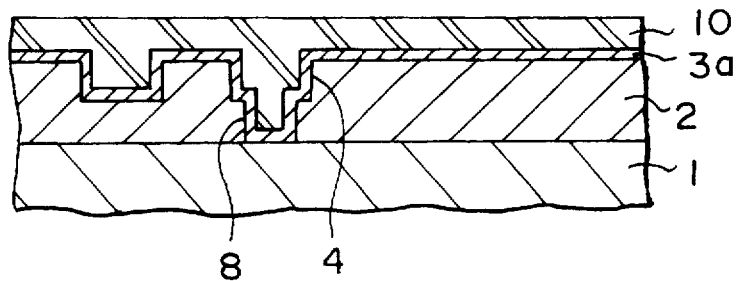
FIG. 2E is a cross sectional view illustrating a process sequence (5) in Embodiment 1.
Figure 2F:
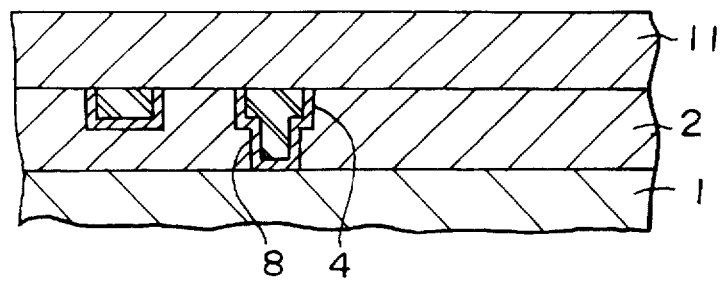
FIG. 2F is a cross sectional view illustrating a process sequence (6) in Embodiment 1.

(a) At first, an inter-layer $SiO_2$ film ① 2 is deposited on a Si substrate 1 (Refer to FIG. 2F).

(b) Then, a groove 4 is formed in a portion corresponding to a connection layer by means of reactive ion etching using a photo resist mask 3 under the following conditions.

| Conditions | Gas C₄F₈ | 50 SCCM |
|---|---|---|
| | Pressure | 2 Pa |
| | RF power | 1200 W |
| | Depth of groove | 0.7 μm |

With this operation, the construction as shown in FIG. 2B is obtained.

(c) After the resist 3 is removed, a 3-layered resist layers 5, 6, 7 with SOG 6 held therebetween is formed. After a contact hole pattern is opened in the upper resist layer 7, the SOG 6 is etched by means of reactive ion etching under the following conditions.

| Conditions | Gas CHF₃/O₂ | 75/8 SCCM |
|---|---|---|
| | Gas pressure | 6.5 Pa |
| | RF power | 1350 W |

Then, the lower photo resist 5 is etched by means of reactive ion etching under the following conditions.

| Conditions | Gas O₂/S₂ Cl₂/N₂ = | 30/10/10 SCCM |
|---|---|---|
| | Pressure | 0.67 Pa |
| | Micro wave power | 850 W |
| | RF power | 30 W |
| | Wafer temperature | −30° C. |

With this operation, the construction as shown in FIG. 2C is obtained.

(d) A contact hole 8 is opened by etching the inter-layer insulating SiO₂ film ① 2 under the following conditions (Refer to 2D).

| Conditions | Gas C₄F₆ | 50 SCCM |
|---|---|---|
| | Pressure | 2 Pa |
| | RF power | 1200 W |

(e) After the resist is removed, a metal film is deposited. Namely a Ti film 3a is deposited by means of sputtering under the following conditions.

| Conditions: | Flow rate of Ar | 100 SCCM |
|---|---|---|
| | Gas pressure | 0.5 Pa |
| | Wafer heated to | 150° C. |
| | Target power | 4 kW |
| | Ti film thickness | 0.1 μm |

Then, an Al—Si film 10 is deposited by means of sputtering under a high temperature (500° C.) under the following conditions.

| Conditions | Flow rate of Ar | 100 SCCM |
|---|---|---|
| | Gas pressure | 0.5 Pa |
| | Wafer heated to | 500° C. |
| | Target power | 22.5 kW |
| | Al film thickness | 0.6 μm |

With this operation, the groove 4 corresponding to a connection layer and the contract hole 8 are filled as shown in FIG. 2E.

(f) Then, the Al film is planarized by polishing. In the present embodiment, a 2-shaft polishing machine used for polishing an Si substrate is used. As Al is soft, no chemical is used for polishing. Cloth made of polyurethane having a chemical resistance is used for polishing an opposite surface. For polishing a surface to be polished, for instance, a 1 wt % aqueous solution is used as an etching liquid (The same effect can be achieved by using a 1 wt % aqueous solution of NaOH). It should be noted that also the same effect can be achieved by using phosphoric acid, a mixture of phosphoric acid and nitric acid, or a mixture of the aforesaid mixture and acetic acid.

After polishing, a plasma CVD SiO₂ film is deposited as an inter-layer insulating SiO₂ film ② 11 under the following conditions.

| Conditions | Gas TEOS/O₂ = | 350/350 SCCM |
|---|---|---|
| | Wafer heated to | 1.33 Pa |
| | RF bias | 350 W |
| | SiO₂ film | 1000 nm |

With this operation, the construction as shown in FIG. 2F can be obtained. Then, also the second connection layer can be formed according to the same procedure.

Embodiment 2

This embodiment is a method of depositing an Al film for the Al connection layer according to Embodiment 1 by means of CVD method. The processes are described below with reference to FIGS. 3A to 3F.

Figure 3A:
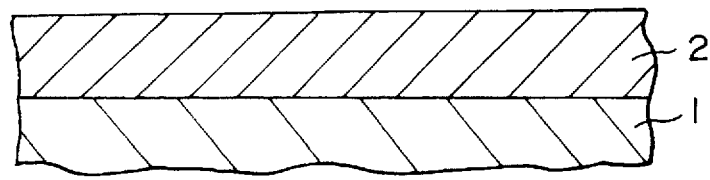
FIG. 3A is a cross sectional view illustrating a process sequence (1) in Embodiment 2.

(a) At first, an inter-layer insulating SiO₂ film ① 2 is deposited on the Si substrate 1 (Refer to FIG. 3A).

Figure 3B:
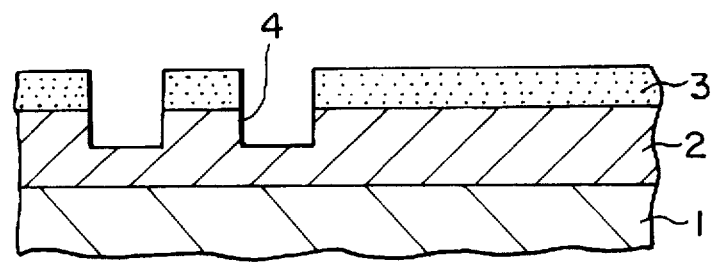
FIG. 3B is a cross sectional view illustrating a process sequence (2) in Embodiment 2.
Figure 3C:
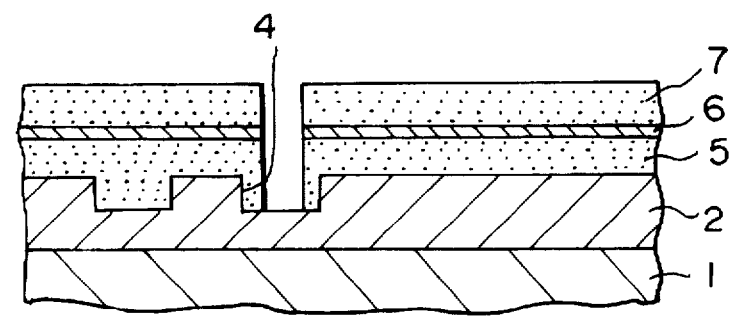
FIG. 3C is a cross sectional view illustrating a process sequence (3) in Embodiment 2.

(b) Then a groove 4 corresponding to a portion of connection layer is formed by means of reactive ion etching using a resist mask 3 (Refer to FIG. 3B).

(c) After the resist is removed, a 3-layered resist layers 5, 6, 7 with SOG held therebetween is formed. Then a contact hole pattern is arranged in the upper resist layer 7 and the SOG is etched by means of reactive etching. Then, the lower resist 5 is etched by means of reactive ion etching (Refer to FIG. 3C).

Figure 3D:
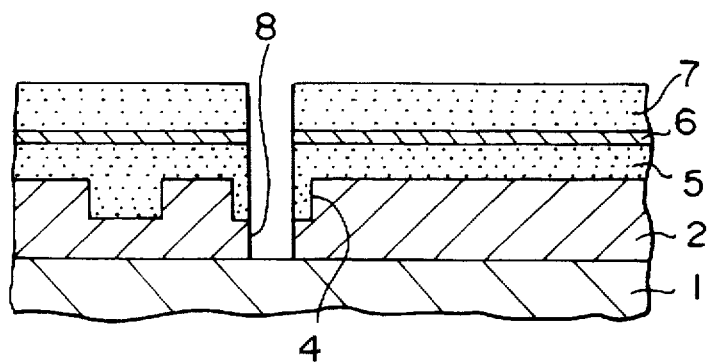
FIG. 3D is a cross sectional view illustrating a process sequence (4) in Embodiment 2.

(d) The contact hole 8 is opened by etching the inter-layer insulating SiO₂ film ① 2 (Refer to FIG. 3D).

The above sequence is the same as that in Embodiment 1.

(e) After the resist is removed, the metal film is deposited.

At first, an Al—Si film 9 is deposited by sputtering under a high temperature under the following conditions to provide a nuclear for growth in the CVD method.

| Conditions | Flow rate of Ar | 100 SCCM |
|---|---|---|
| | Gas pressure | 0.5 Pa |
| | Wafer heated to | 500° C. |
| | Target power | 5 kW |
| | Al film thickness | 50 nm |

Then, an Al film 10 is deposited on the entire surface of the substrate by means of CVD method. Conditions for depositing the film are as follows.

| Raw material gas: | Dimethyl aluminium hydride [DMAH, AlH (CH₈)₂] and H₂ |
|---|---|
| | Partial pressure of DMAH: 0.4 Pa |
| | Partial pressure of H₂: 140 Pa |
| | Wafer heated to: 300° C. |
| | Al film thickness: 0.6 μm |

Figure 3E:
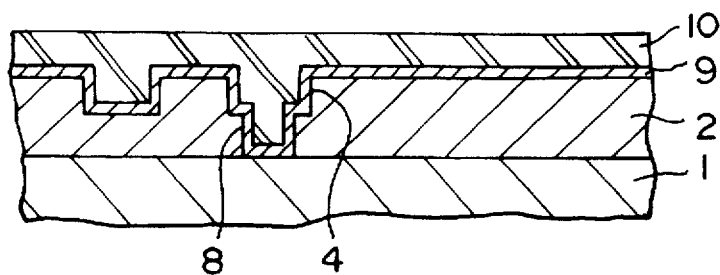
FIG. 3E is a cross sectional view illustrating a process sequence (5) in Embodiment 2.

With this operation, the groove 4 corresponding to a connection layer and the contact hole are filled up as shown in FIG. 3E.

(f) Then, the AL film 10.9 is planarized by polishing.

In this case, a 10 wt % aqueous solution of ferric chloride is used as an etching liquid. Ferric has a slightly larger ionization tendency than that of Al, and is suited to etching Al at a lower rate.

Figure 3F:
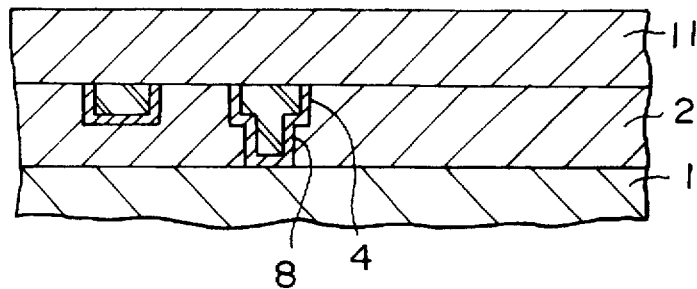
FIG. 3F is a cross sectional view illustrating a process sequence (6) in Embodiment 2.

Then, a plasma CVD $SiO_2$ film is deposited as an inter-layer insulating $SiO_2$ film ② 11 (Refer to FIG. 3F).

Then, the second connection layer can be formed similarly.

Embodiment 3

In this embodiment, planarization of Al film for Al connection layer is performed in the contact hole and in the connection layer respectively to alleviate difficulties in filling Al. Refer to FIG. 4A to FIG. 4F.

(a) At first, an inter-layer insulating $SiO_2$ film ① 2 is deposited on the Si substrate 1. Then a contact hole 8 is opened by means of re active ion etching using a resist mask under the following conditions.

| Conditions | Gas $C_4F_8$ | 50 SCCM |
|---|---|---|
| | Pressure | 2 Pa |
| | RF power | 1200 W |
| | Depth of groove | 0.7 μm |

After the resist is removed, a metal film is deposited. At first, a Ti film ① 3a is deposited by sputtering under the following conditions.

| Conditions | Flow rate of Ar | 100 SCCM |
|---|---|---|
| | Gas pressure | 0.5 Pa |
| | Wafer heated to | 150° C. |
| | Target power | 4 kW |
| | Ti film thickness | 0.1 μm |

Then, An Al—Si film ① 9a is deposited by sputtering under the following conditions.

| Conditions | Flow rate of Ar | 100 SCCM |
|---|---|---|
| | Gas pressure | 0.5 Pa |
| | Wafer heated to | 500° C. |
| | Target power | 22.5 kW |
| | Al film thickness | 0.6 μm |

Figure 4A:
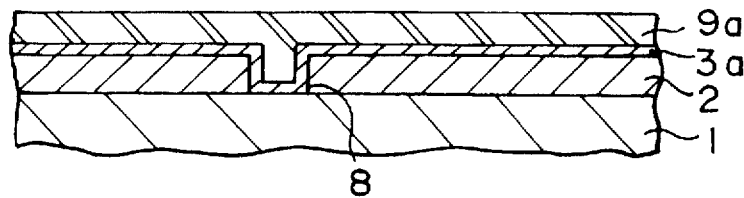
FIG. 4A is a cross sectional view illustrating a process sequence (1) in Embodiment 3.
Figure 4B:
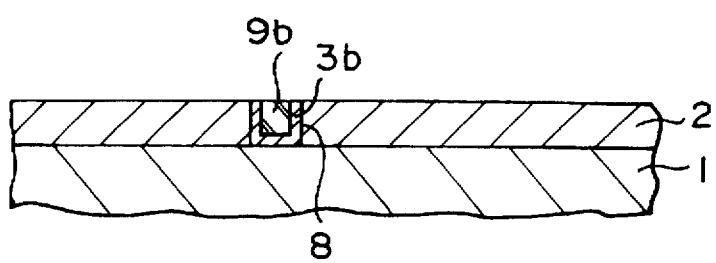
FIG. 4B is a cross sectional view illustrating a process sequence (2) in Embodiment 3.
Figure 4C:
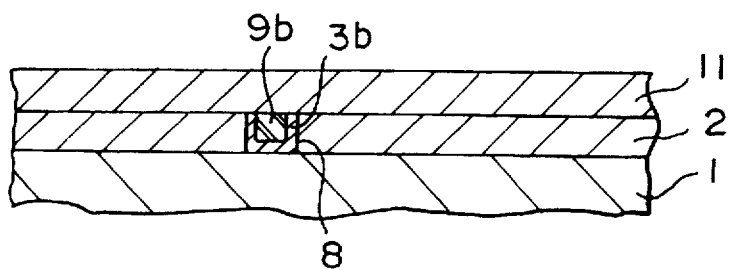
FIG. 4C is a cross sectional view illustrating a process sequence (3) in Embodiment 3.
Figure 4D:
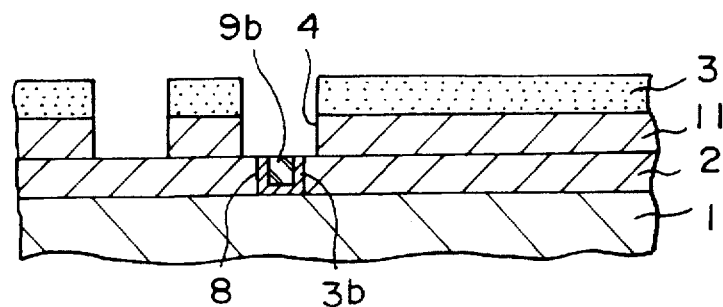
FIG. 4D is a cross sectional view illustrating a process sequence (4) in Embodiment 3.

Thus, the contact hole 8 has been filled up as shown in FIG. 4A.

(b) Then the Al film is planarized by polishing. The polishing method is the same as in Embodiment 1 (Refer to FIG. 4B). The Al—Si film ① after polished is indicated by the reference numeral 9a and the Ti film after polished is indicated by the reference numeral 3b.

(c) Then, a plasma CVD $SiO_2$ film is deposited as an inter-layer insulating $SiO_2$ film ② 11 under the following conditions.

| Conditions | Gas $TEOS/O_2$ = | 350/350 SCCM |
|---|---|---|
| | Pressure | 1.33 kPa |
| | Wafer heated to | 390° C. |
| | RF bias | 350 W |
| | $SiO_2$ film thickness | 500 nm |

(d) A groove is formed in a portion corresponding to a connection layer by means of reactive ion etching using a resist mask 3.

| Conditions | Gas $C_4F_8$ | 50 SCCM |
|---|---|---|
| | Pressure | 2 Pa |
| | RF bias | 1200 W |
| | Depth of groove | 0.7 μm |

(e) After the resist is removed, a metal film is deposited. At first, a Ti film ② 81 is deposited by means of sputtering under the conditions.

| Conditions | Flow rate of Ar | 100 SCCM |
|---|---|---|
| | Gas pressure | 0.5 Pa |
| | Wafer heated to | 150° C. |
| | Target power | 4 kW |
| | Ti film thickness | 0.1 μm |

Then, an Al—Si film ② 9 is deposited by means of sputtering under the following conditions.

| Conditions | Flow rate of Ar | 100 SCCM |
|---|---|---|
| | Gas pressure | 0.5 Pa |
| | Wafer heated to | 500° C. |
| | Target power | 22.5 kW |
| | Al film thickness | 0.6 μm |

Figure 4E:
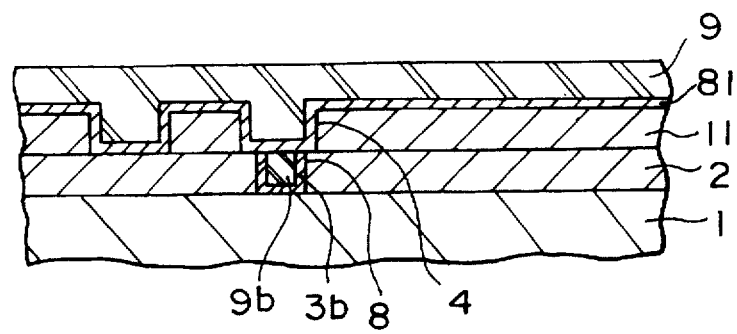
FIG. 4E is a cross sectional view illustrating a process sequence (5) in Embodiment 3.

With this operation, a groove corresponding to a connection layer is filled up as shown in FIG. 4E.

(f) Then the Al film is planarized by polishing. The polishing method is the same as in Embodiment 1. Then, a plasma CVD $SiO_2$ film is deposited as an inter-layer insulating $sio_2$ film ③ 11' under the following conditions.

| Conditions | Gas $TEOS/O_2$ = | 350/350 SCCM |
|---|---|---|
| | Pressure | 1.33 kPa |
| | Wafer heated to | 390° C. |
| | RF bias | 350 W |
| | $SiO_2$ film thickness | 1000 nm |

Figure 4F:
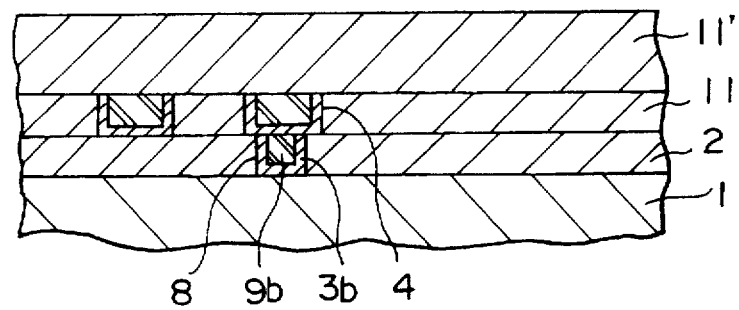
FIG. 4F is a cross sectional view illustrating a process sequence (6) in Embodiment 3.

With this operation, the construction as shown in FIG. 4F is obtained.

Then, the second connection layer can be formed according to the similar procedure.

In Embodiments 1 to 3 described above, the effects as described below can be obtained.

① The entire surface of a substrate can be carried out completely. In addition, as compared to planarization of an inter-layer insulating film, the process is simple.

② Flatness can be maintained even if Al connection layers are piled up.

③ Thickness of a connection layer formed according to this method is homogeneous, so that an Al connection layer having a high reliability can be formed.

④ After corrosion often generated in the conventional type of reactive ion etching technology for Al films is eliminated, so that principally complete planarization can be carried out.

Embodiment 4

Processes in this embodiment are described below with reference to FIG. 5A to FIG. 5C.

Figure 5A:
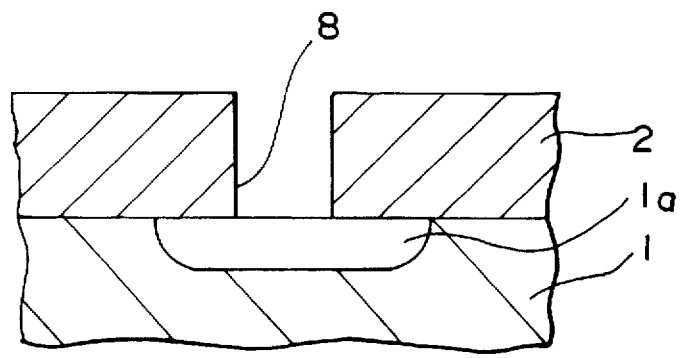
FIG. 5A is a cross sectional view illustrating a process sequence (1) in Embodiment 4.

(a) At first, an inter-layer insulating $SiO_2$ film 2 is deposited on the substrate 1 as shown in FIG. 5A, and then a contact hole 8 is opened. The reference numeral 1a indicates a diffusion layer.

Figure 5B:
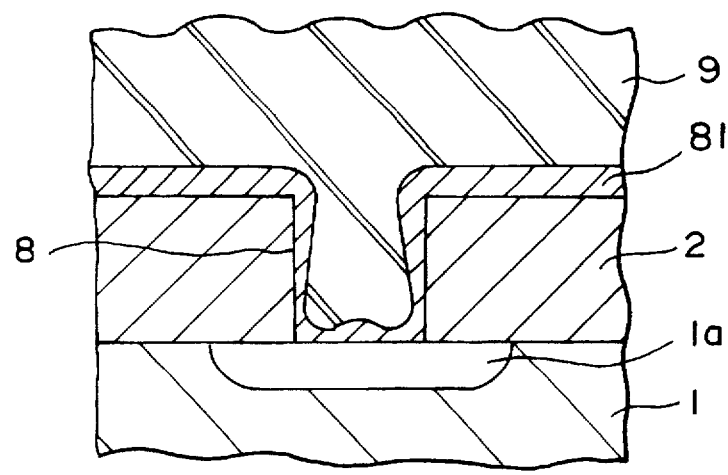
FIG. 5B is a cross sectional view illustrating a process sequence (2) in Embodiment 4.
Figure 5C:
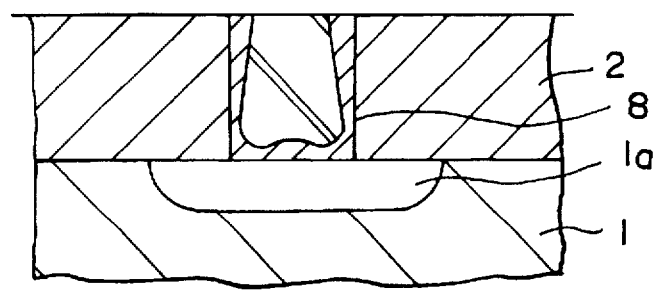
FIG. 5C is a cross sectional view illustrating a process sequence (3) in Embodiment 4.

(b) Then, a metal film is deposited as shown in FIG. 5B. At first, a Ti film 81 is deposited by means of sputtering.

| Conditions | Flow rate of Ar | 100 SCCM |
|---|---|---|
|  | Gas pressure | 0.5 Pa |
|  | Water heated to | 150° C. |
|  | Target power | 4 kW |
|  | Ti film thickness | 0.1 µm |

Then, an Al—Si film 9 is deposited by means of sputtering under the following conditions.

| Conditions | Flow rate of Ar | 100 SCCM |
|---|---|---|
|  | Gas pressure | 0.5 Pa |
|  | Wafer heated to | 500° C. |
|  | Target power | 22.5 kW |
|  | Al film thickness | 0.8 µm |

With this operation, the contact hole is filled up, but the surface of Al—Si film 9 is irregular as shown in FIG. 5B.

(c) Then, the surface of the Al film 9 is planarized. In this case, a 2-shaft rotary polishing machine generally used for polishing an Si substrate is used. As Al is soft, any chemical for polishing is not used. chemical resistant cloth is used to an opposite face. As an etching liquid for a surface to be etched, for instance phosphoric acid is used. Al etching rate with phosphoric acid under a room temperature is around 30 nm/minute. For this reason, Al is removed by around 300 nm by polishing for 10 minutes. As a result, the surface of the Al—Si film 9 is planarized as shown in FIG. 5C.

With this operation, the problem relating to reliability that, if thickness of a connection layer partially varies, a current density goes up in a thin portion and the connection layer may easily be disconnected there due to electromigration is eliminated. Also it is easy to check for any void or hillock (projection) in Al. If a surface of a substrate is irregular, it is difficult to distinguish this irregularity from these defects, so that also the merit is also helpful.

In the present embodiment, thickness of a connection layer is homogenized, an Al connection layer having a high reliability can be formed, checking for voids and hillocks which are defects in an Al connection layer is very easy, and Al on the alignment mark can be removed, so that pattern alignment can easily be carried out with a stepper.

Figure 11A:
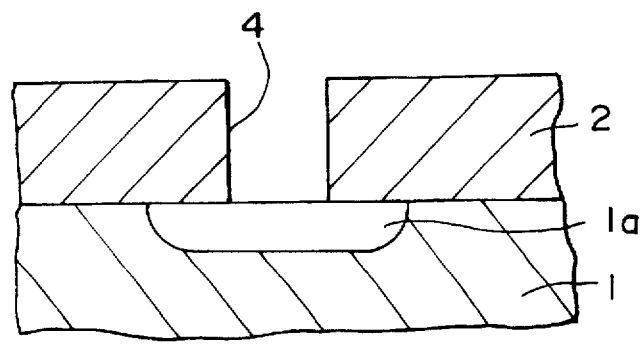
FIGS. 11A and 11B is a drawing illustrating the prior art.
Figure 11B:
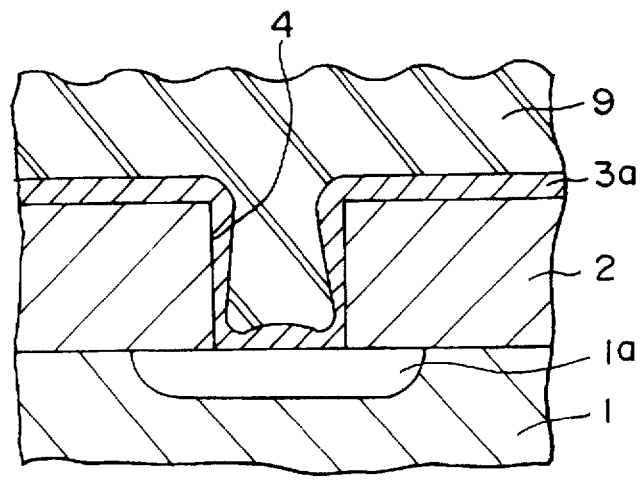
Figure 13:
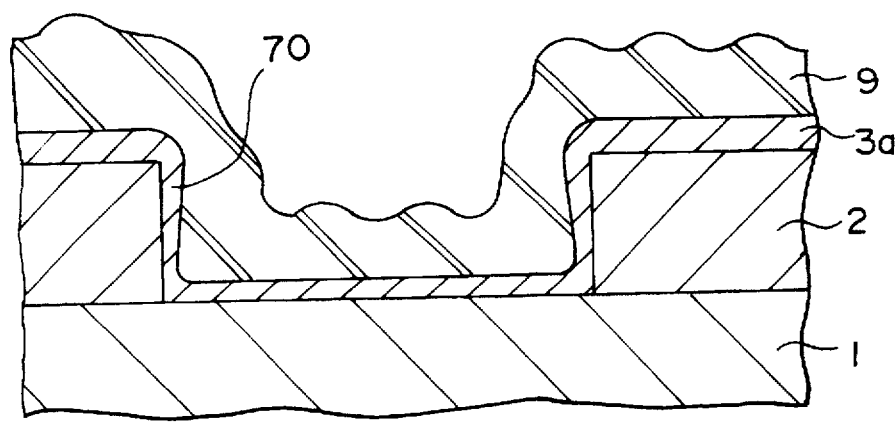
FIG. 13 is a drawing illustrating a problem.

Namely, in a case where the aforesaid AL—Si film is deposited under a high temperature of, for instance, 500° C., crystals each having a thickness in a range from 1 to 2 µm grow and the surface shows a remarkable irregularity in its flatness in a range from 0.1 to 0.2 µm, and the shape of the grinding can hardly be seen through the Al film because of planarization. In addition, if a thickness of the film partially changes, a current density increases in a thin portion and electromigration may easily occur, thus a reliability problem can result. Furthermore, the base can hardly be seen because of planarization and the irregularity of the surface makes it difficult to discern the grinding, so that in a lithography process as shown in FIG. 13 for the construction formed as shown in FIG. 11, the alignment mark can hardly be seen and alignment is difficult. In the present embodiment, however, all the problems as described above can be solved. Namely, because the alignment mark has a thickness of around 4 µm, the alignment mark is not planarized completely and it is possible to discern it through the Al film, but a alignment precision requiring the thickness of around 0.1 µm can not be achieved.

Embodiment 5

Description is made hereinafter for processes in the present embodiment with reference to FIG. 6A to FIG. 6D.

Figure 6A:
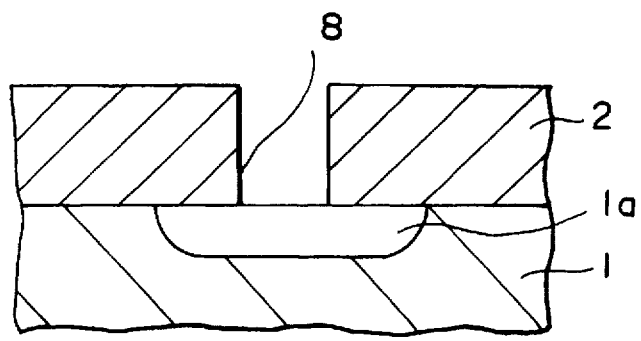
FIG. 6A is a cross sectional view illustrating a process sequence (1) in Embodiment 5.

(a) At first, as shown in FIG. 6A, an inter-layer insulating $SiO_2$ film is deposited on the Si substrate 1, and then a contact hole 8 is opened. The reference numeral 1a indicates a diffusion layer.

Figure 6B:
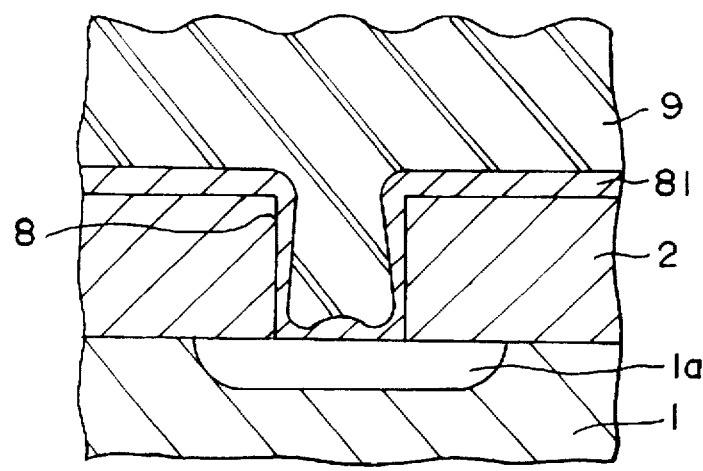
FIG. 6B is a cross sectional view illustrating a process sequence (2) in Embodiment 5.
Figure 6C:
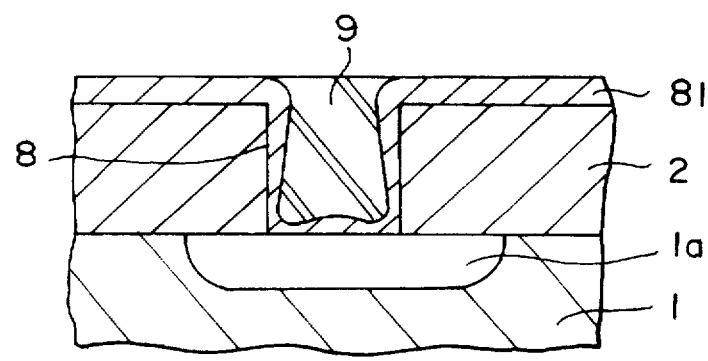
FIG. 6C is a cross sectional view illustrating a process sequence (3) in Embodiment 5.

(b) Then, a metal film is deposited as shown in FIG. 6B.

At first, a Ti① 81 film is deposited by means of sputtering. The conditions are the same as those in Embodiment 4. Then, an Al—Si film ① 9 is deposited by means of sputtering. The conditions are the same as those in Embodiment 4. With this operation, the construction as shown in FIG. 6B is obtained.

Then, the surface of AL film 9 is planarized. The conditions are the same as those in Embodiment 4. However, by polishing the surface for about 37 minutes, Al deposited to the thickness of 800 nm is removed from all places other than the contact hole 8 section. Then, the Ti film ② 82 and the AL—Si film ② 9' are deposited. Namely, at first the Ti film ② 82 is deposited by means of sputtering under the following conditions.

| Conditions | Flow rate of Ar | 100 SCCM |
|---|---|---|
|  | Gas pressure | 150° C. |
|  | Wafer heated to | 150° C. |
|  | Target power | 4 kW |
|  | Ti film thickness | 0.1 µm |

Figure 6D:
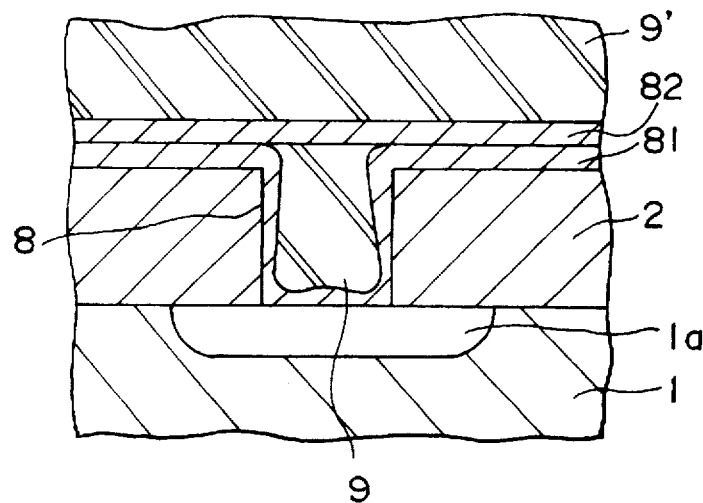
FIG. 6D is a cross sectional view illustrating a process sequence (4) in Embodiment 5.

Then, the Al—Si film ② 9' as shown in FIG. 6D is deposited by means of sputtering under the following conditions.

| Conditions | Flow rate of Ar | 100 SCCM |
|---|---|---|
|  | Gas pressure | 0.5 Pa |
|  | Wafer heated to | 150° C. |
|  | Target power | 22.5 kW |
|  | Al film thickness | 0.8 µm |

With this operation, the construction as shown in FIG. 6D is obtained.

Embodiment 6

In the present embodiment, an alignment mark is exposed by planarizing an AL film for an Al connection layer by means of polishing. The processes are described with reference to FIG. 7A to FIG. 7D.

Figure 7A:
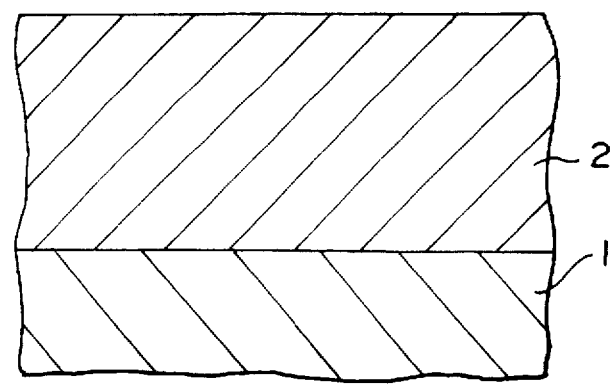
FIG. 7A is a cross sectional view illustrating a process sequence (1) in Embodiment 6.

(a) At first, as shown in FIG. 7A, an inter-layer insulating $SiO_2$ film 2 is deposited to the depth of 1.0 µm, larger than the ordinary thickness of 0.5 µm.

Figure 7B:
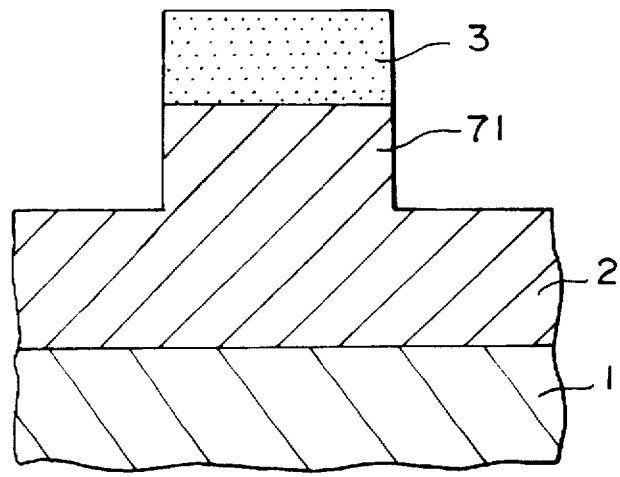
FIG. 7B is a cross sectional view illustrating a process sequence (2) in Embodiment 6.
Figure 7C:
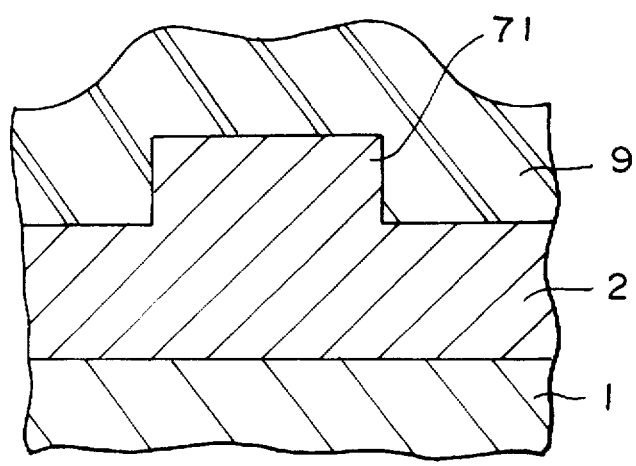
FIG. 7C is a cross sectional view illustrating a process sequence (3) in Embodiment 6.

(b) Then, as shown in FIG. 7B, an alignment mark 71 used for a stepper is patterned using a photo resist 3, and the $SiO_2$ film is etched by 0.5 µm by means of reactive ion etching.

(c) After the photo resist is removed, the Al—Si film 9 is deposited by means of sputtering. The conditions are the same as those in Embodiment 4 (Refer to FIG. 7C).

Figure 7D:
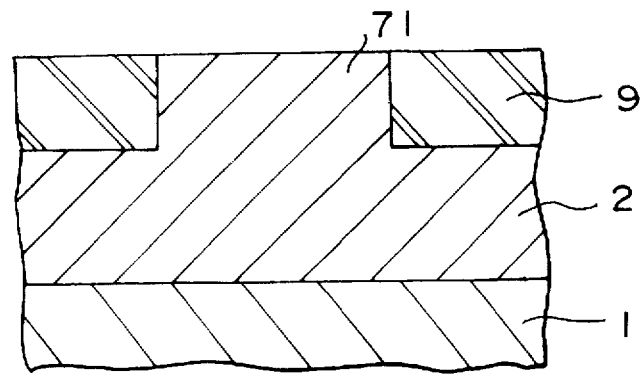
FIG. 7D is a cross sectional view illustrating a process sequence (4) in Embodiment 6.

(d) Then, the surface of the Al film is planarized by polishing. The conditions are the same as those in Embodiment 4. As a result, as shown in FIG. 7D, the Al—Si film 9 in a portion just above an alignment mark 71 is removed, so that the top surface of the alignment mark 71 is exposed and alignment can easily be carried out with a stepper.

Embodiment 7

The present embodiment is a case where a small pattern for stopper is formed simultaneously when a groove for a connection layer is formed.

In a case where only polishing is carried out, an Al film becomes thinner in a portion of wide Al connection layer B. Namely, when polished, Al is damaged by pressure from the cloth and etching is performed faster there, and in case of wide Al connection layer B, a larger pressure is loaded to the central section and the section is apt to become thinner. This phenomenon is prevented in this embodiment.

Processes in the present embodiment are described hereinafter with reference to FIG. 8A to FIG. 8F.

Figure 8A:
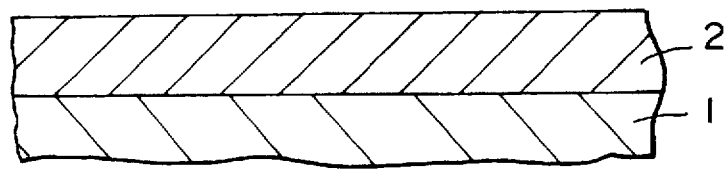
FIG. 8A is a cross sectional view illustrating a process sequence (1) in Embodiment 7.

(a) At first, an inter-layer insulating $SiO_2$ film① 2 is deposited on the Si substrate 1 (Refer to FIG. 8A).

(b) A groove 4 corresponding to a connection layer is provided by means of reactive ion etching using a resist mask 3 under the following conditions.

| Conditions | Gas $C_4F_8$ | 50 SCCM |
|---|---|---|
| | Pressure | 2 Pa |
| | RF power | 1200 W |
| | Depth of groove | 0.7 μm |

Figure 8B:
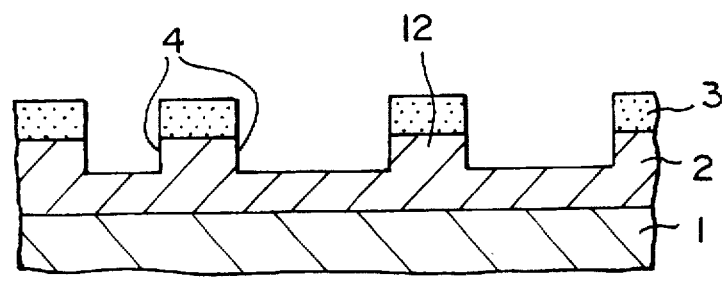
FIG. 8B is a cross sectional view illustrating a process sequence (2) in Embodiment 7.
Figure 12:
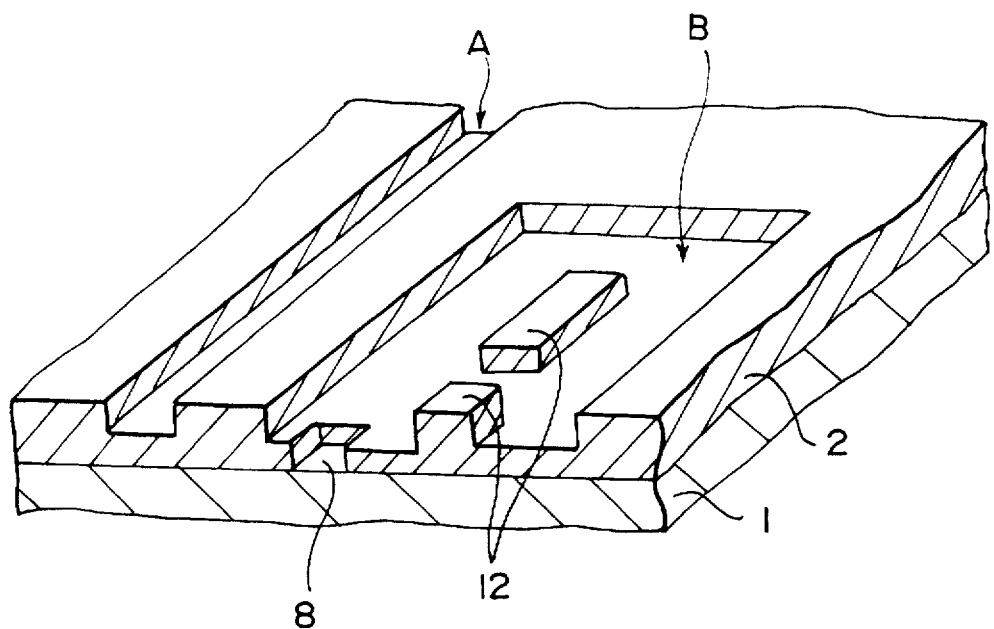
FIG. 12 is a drawing for explanation of Embodiment 7.

In this process, a small pattern 12 for a stopper is formed simultaneously (Refer to FIG. 8B). A perspective view of this construction is shown in FIG. 12.

(c) The subsequent processes are performed like in the embodiment above. Detailed description of the conditions for the processes is omitted herein (Refer to each of the embodiments above). Namely, after the resist is removed, a 3-layered resist 5, 6, 7 with SOG held therebetween is formed. After a contact hole pattern is opened in the upper resist 7, the SOG is etched by means of reactive ion etching.

Figure 8C:
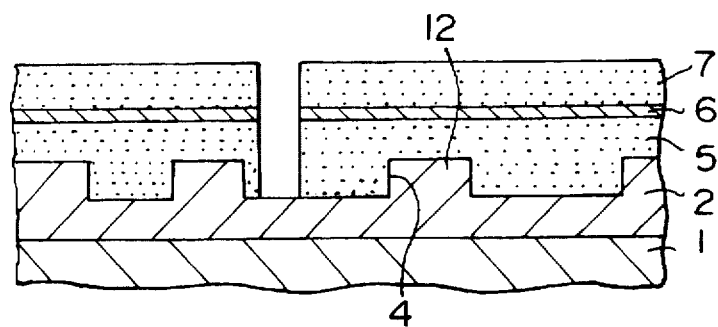
FIG. 8C is a cross sectional view illustrating a process sequence (3) in Embodiment 7.

Then, the lower resist 5 is etched by means of reactive ion etching (Refer to FIG. 8C).

Figure 8D:
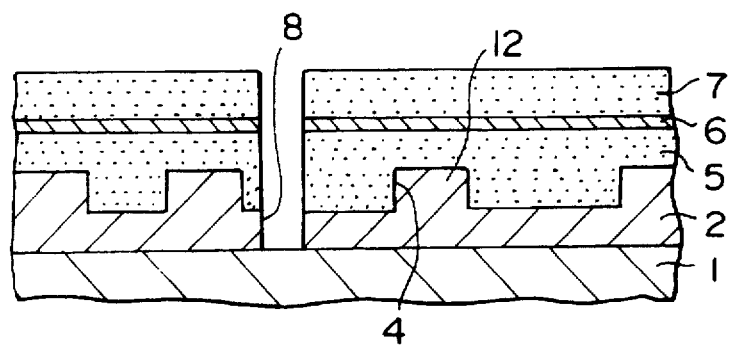
FIG. 8D is a cross sectional view illustrating a process sequence (4) in Embodiment 7.
Figure 8E:
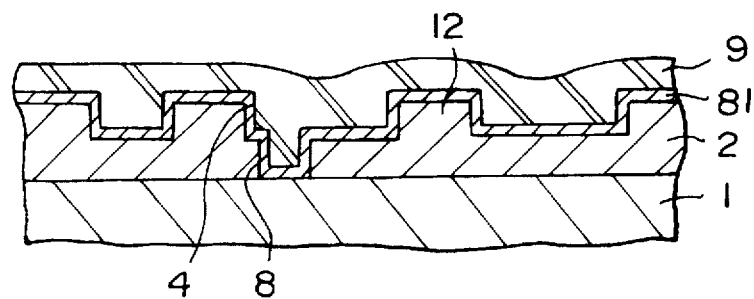
FIG. 8E is a cross sectional view illustrating a process sequence (5) in Embodiment 7.

(d) A contact hole 8 is opened by etching the inter-layer insulating $SiO_2$ film ① 2 (Refer to FIG. 8D).

(e) After the resist is removed, a metal film is deposited. Namely, at first a Ti film 81 is deposited by means of sputtering. Then, an AL—Si film 9 is deposited by means of sputtering.

With this operation, a groove 4 corresponding to a connection layer and a contact hole 8 are filled up.

Figure 8F:
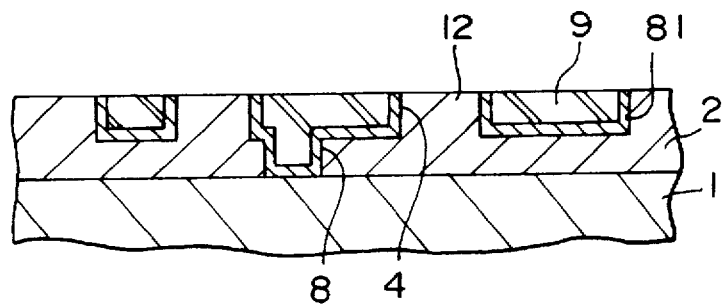
FIG. 8F is a cross sectional view illustrating a process sequence (6) in Embodiment 7.

(f) Then, the Al film 9 is planarized by polishing as shown in FIG. 8F.

As a result, a wide portion of a connection layer which is apt to be thinner in the prior art is as thick as a narrow section of the connection layer as polishing is stopped by a small pattern 12 which functions as a stopper.

Embodiment 8

The present embodiment is a method of forming a small pattern for stopper as described in Embodiment 7 using a different material from that for the inter-layer insulating film. Refer to FIG. 9A to FIG. 9H.

Figure 9A:
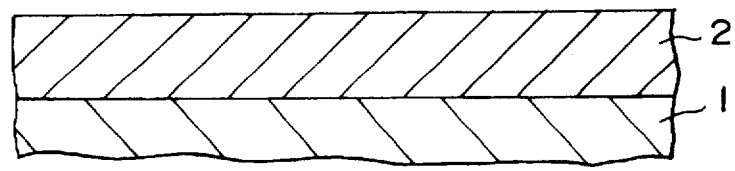
FIG. 9A is a cross sectional view illustrating a process sequence (1) in Embodiment 8.

(a) At first, an inter-layer insulating $SiO_2$ film ① 2 is deposited on the Si substrate 1 (Refer to FIG. 9A).

Figure 9B:
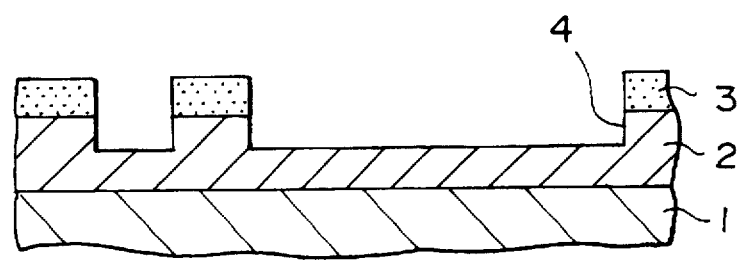
FIG. 9B is a cross sectional view illustrating a process sequence (2) in Embodiment 8.

(b) Then, a groove 4 is provided in a portion corresponding to a connection layer by means of reactive ion etching using a resist mask 3 (Refer to FIG. 9B).

In this process, the small pattern 12 for stopper is not formed.

Figure 9C:
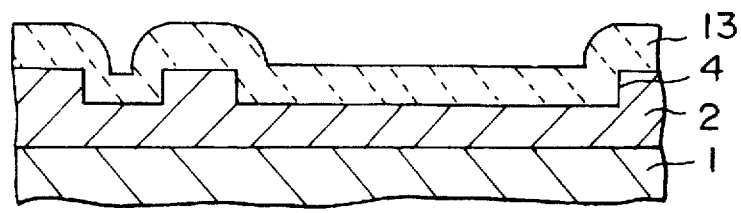
FIG. 9C is a cross sectional view illustrating a process sequence (3) in Embodiment 8.

(c) Then, a plasma SiN 13 is deposited to the thickness of 500 nm on the entire surface of the substrate under the following conditions (Refer to FIG. 9C).

| Conditions | Gas $SiH_4/NH_3/N_2$ = | 290/1730/1000 SCCM |
|---|---|---|
| | Pressure | 332 Pa |
| | Temperature for growth | 400° C. |

Figure 9D:
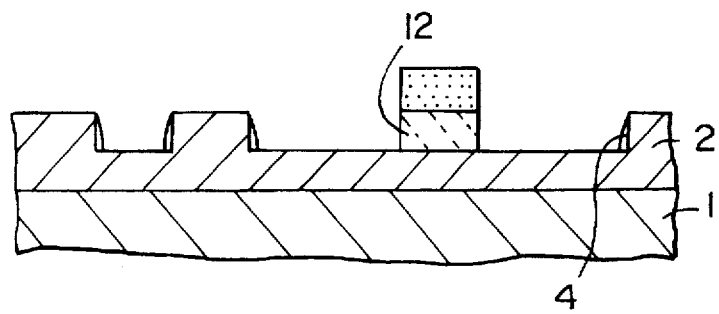
FIG. 9D is a cross sectional view illustrating a process sequence (4) in Embodiment 8.
Figure 9E:
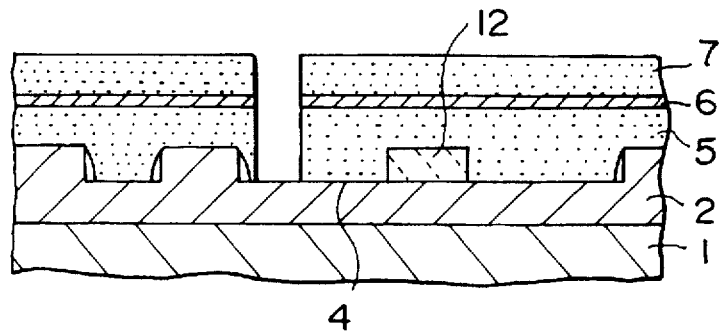
FIG. 9E is a cross sectional view illustrating a process sequence (5) in Embodiment 8.

(d) A small pattern for stopper is formed by means of reactive ion etching using a resist mask (Refer to FIG. 9D).

Then the following processes are carried out according to the same procedure as in Embodiment 7.

(e) After the resist is removed, a 3-layered resist 5, 6, 7 with SOG held therebetween is formed. After a contact hole pattern is opened in the upper resist 7, the SOG is etched by means of reactive ion etching (Refer to FIG. 9E).

Figure 9F:
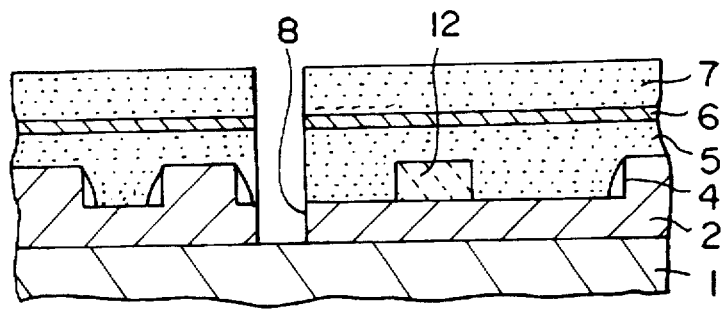
FIG. 9F is a cross sectional view illustrating a process sequence (6) in Embodiment 8.

(f) A contact hole 8 is opened by etching the inter-layer insulating $SiO_2$ film ① 2 (Refer to FIG. 9F).

(g) After the resist is removed, a metal film is deposited. Namely, at first a Ti film 81 is deposited by means of sputtering.

Then, an Al—Si film 9 is deposited by means of sputtering.

Figure 9G:
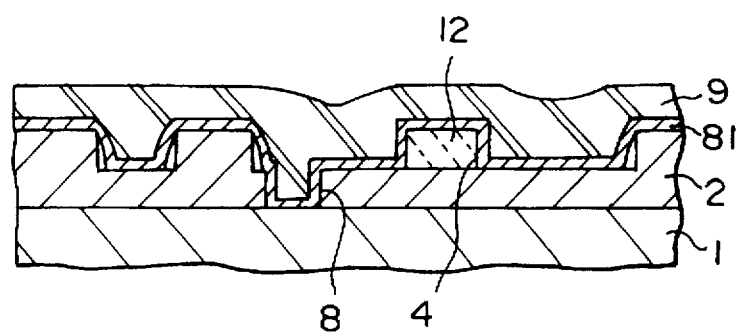
FIG. 9G is a cross sectional view illustrating a process sequence (7) in Embodiment 8.
Figure 9H:
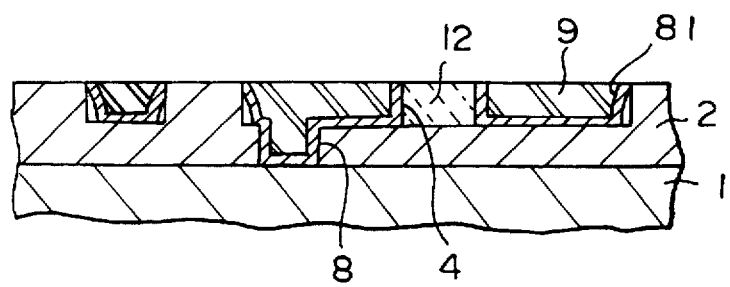
FIG. 9H is a cross sectional view illustrating a process sequence (8) in Embodiment 8.
Figure 10:
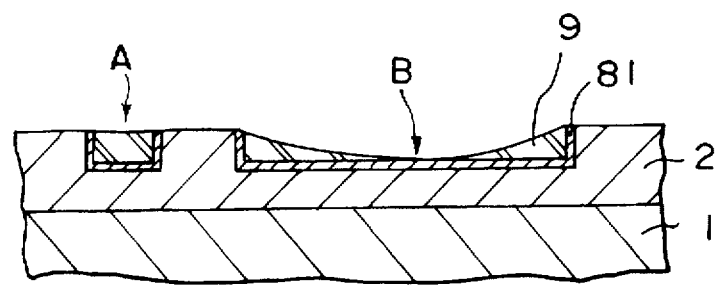
FIG. 10 is a drawing illustrating a problem.

With this operation, the groove 4 corresponding to a connection layer and the contact hole 8 are filled up (Refer to FIG. 9G).

(h) Then the Al film is planarized by polishing. As shown in FIG. 43, also in a wide portion of a connection layer which is thin in the prior art, polishing is stopped by the small pattern 12 for stopper, so that a thickness of the connection layer is the same as that in a narrow portion of the connection layer.

The following effects can be expected in this embodiment as well as in Embodiment 7.

① The entire surface of a wafer can completely be planarized.

② A film thickness in a narrow section A is the same as that in a wide section B.

③ An Al connection layer having a high reliability can be formed because of the homogeneous thickness of the connection layer.

④ Thickness of each connection layer can freely be controlled by changing a material of stopper or a film thickness.

Embodiment 9

In this embodiment, after the surface of Al-based material is planarized by polishing, an antireflection film is deposited on the entire surface of the substrate. With this, a problem of pattern deformation due to reflection in a post processing can be eliminated.

If it is tried to form an Al-based base connection layer with Al or Al-alloy having a high reflectance and then cover the base connection layer with an inter-layer insulating film for forming a connection hole between the base connection layer and the upper connection layer, pattern distortion is generated in a lithography process due to effects by reflection on the ground and the pattern may be deformed, but also this problem is solved in the present embodiment (It should be noted that, as a reflection preventing film can be left in an Al patterning method not dependent on polishing as in the usual method, generally a problem due to reflection does not occur in the post processing process like this). In the present embodiment, a reflection preventing film is removed by polishing and is left only on an Al connection layer. Description is made for this process with reference to FIG. 14A through FIG. 14K.

Figure 14A:
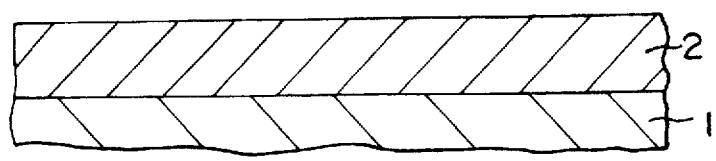
FIG. 14A is a cross sectional view illustrating a process sequence (1) in Embodiment 9.

(a) At first, an inter-layer insulating SiO₂ film ①2 is deposited (Refer to FIG. 14A).

(b) A groove 4 is provided in a portion corresponding to a connection layer by means of reactive ion etching using a resist photo mask 3. The conditions are as follows.

| Conditions | Gas C₄F₈ | 50 SCCM |
|---|---|---|
| | Gas pressure | 2 Pa |
| | RF power | 1200 W |
| | Depth of groove | 0.7 μm |

Figure 14B:
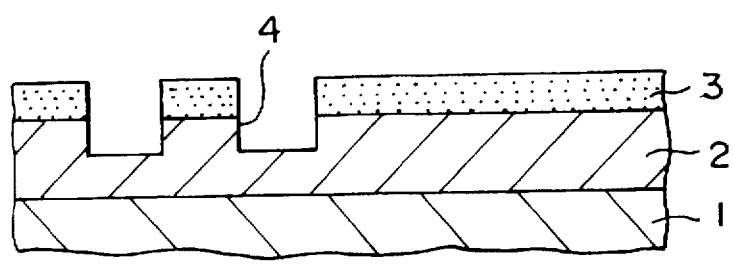
FIG. 14B is a cross sectional view illustrating a process sequence (2) in Embodiment 9.

With this operation, the construction as shown in FIG. 14B is obtained.

(c) After the resist is removed, a 3-layered resist 5, 6, 7 with SOG 6 held therebetween is formed. After a contact hole pattern is opened in the upper resist 7, the SOG is etched by means of reactive ion etching.

Figure 14C:
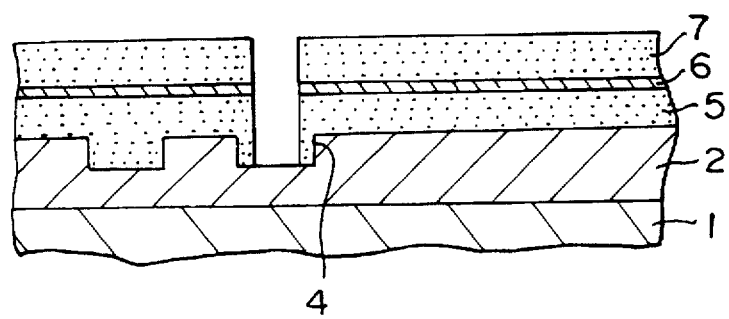
FIG. 14C is a cross sectional view illustrating a process sequence (3) in Embodiment 9.

Then, the lower resist 5 is etched by means of reactive ion etching. With this operation, the construction as shown in FIG. 14C is obtained.

Figure 14D:
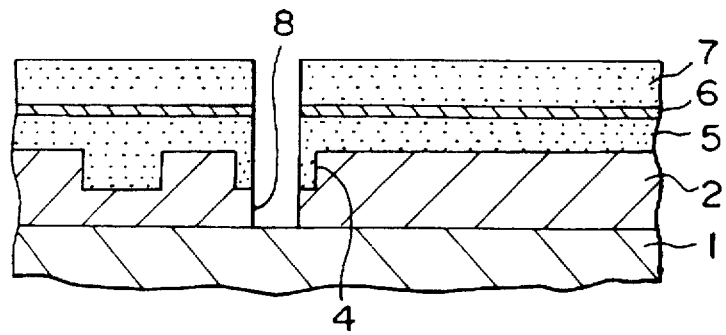
FIG. 14D is a cross sectional view illustrating a process sequence (4) in Embodiment 9.
Figure 14E:
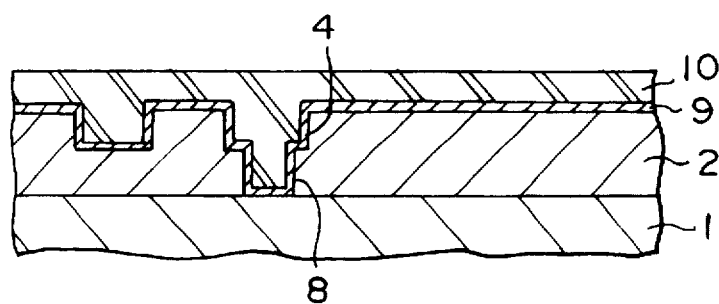
FIG. 14E is a cross sectional view illustrating a process sequence (5) in Embodiment 9.

(d) A contact hole 8 is opened by etching the inter-layer insulating SiO₂ film①2 (Refer to FIG. 14D).

(e) After the resist is removed, a metal film is deposited. Namely, an Ti film 9 is deposited by means of sputtering. The conditions are as follows.

| Conditions | Flow rate of Ar | 100 SCCM |
|---|---|---|
| | Gas pressure | 0.5 Pa |
| | Wafer heated to | 150° C. |
| | Target power | 4 kW |
| | Ti film thickness | 0.1 μm |

Then, an Al—Si film 10 is deposited by means of sputtering. The conditions are as follows.

| Conditions | Flow rate of Ar | 100 SCCM |
|---|---|---|
| | Gas pressure | 0.5 Pa |
| | Wafer heated to | 500° C. |
| | Target power | 22.5 kW |
| | Al film thickness | 0.6 μm |

With this operation, the groove 4 corresponding to a connection layer and the contact hole 8 are filled up (Refer to 14E).

(f) Then, the Al film is planarized by polishing.

Figure 14F:
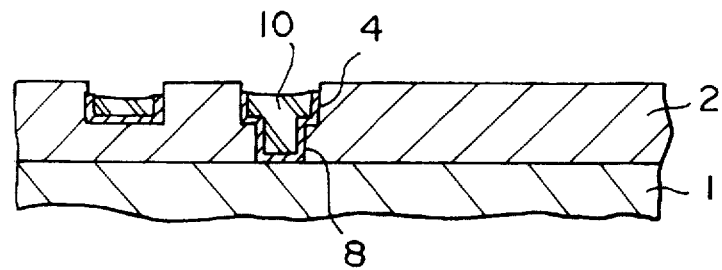
FIG. 14F is a cross sectional view illustrating a process sequence (6) in Embodiment 9.

In this process, the surface of Al film is made lower by around 0.1 μm from the surface of the inter-layer insulating SiO₂ film ①2 by polishing the Al film excessively. The case shown in FIG. 14F is a little exaggerated.

Figure 14G:
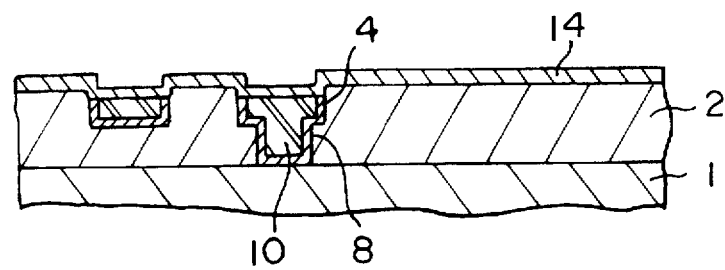
FIG. 14G is a cross sectional view illustrating a process sequence (7) in Embodiment 9.

(g) A TiON film 14 is deposited by means of sputtering, and the construction as shown in FIG. 14G is obtained. The conditions are as follows.

| Conditions | Gas Ar/N₂ = | 40/70 SCCM |
|---|---|---|
| | Gas pressure | 0.5 Pa |
| | Wafer heated to | 150° C. |
| | Target power | 5 kW |
| | Ti film thickness | 30 nm |

Figure 14H:
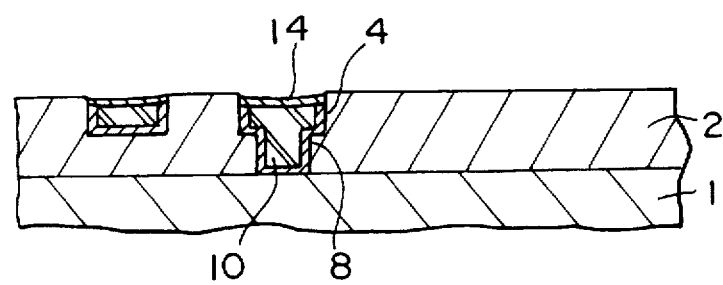
FIG. 14H is a cross sectional view illustrating a process sequence (8) in Embodiment 9.

(h) The TiON film is removed from the area other than a portion corresponding to a connection layer by polishing for planarization (Refer to FIG. 14H).

Figure 14I:
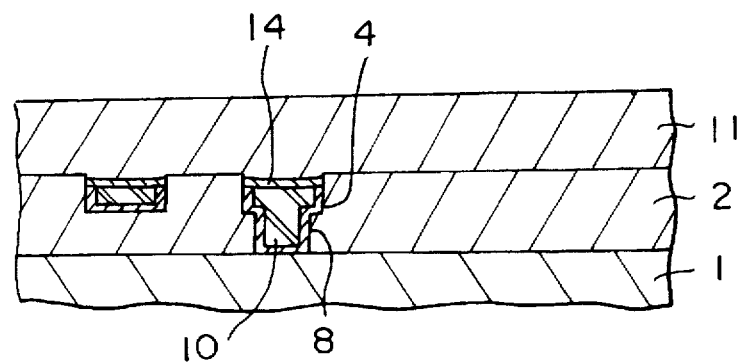
FIG. 14I is a cross sectional view illustrating a process sequence (9) in Embodiment 9.

(i) An SiO₂ film ②11 is formed as an inter-layer insulating film (Refer to FIG. 14I).

Figure 14J:
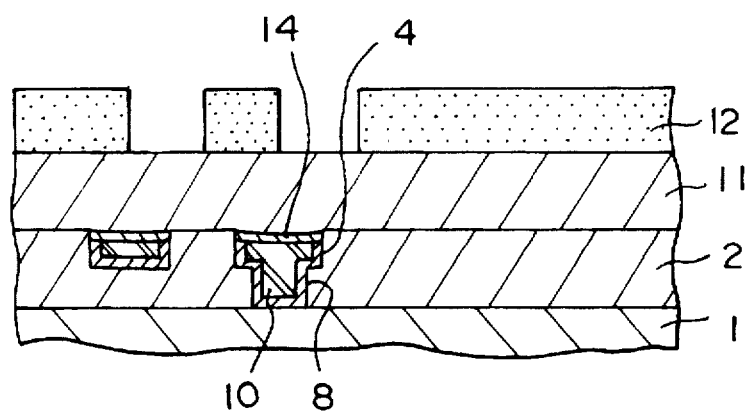
FIG. 14J is a cross sectional view illustrating a process sequence (10) in Embodiment 9.
Figure 14K:
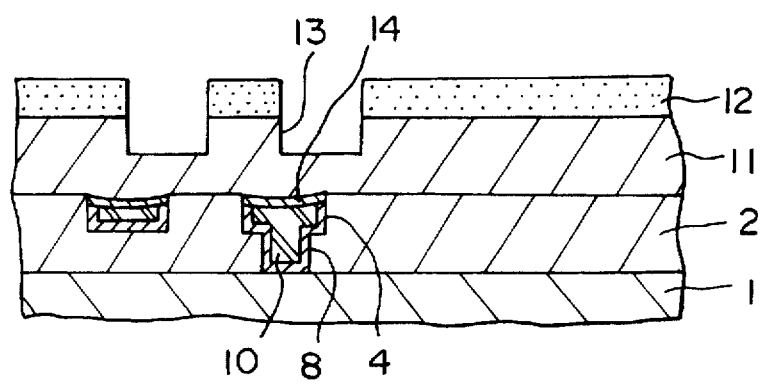
FIG. 14K is a cross sectional view illustrating a process sequence (11) in Embodiment 9.

(j) Resist 12 is applied to form a second connection layer pattern (Refer to FIG. 14J). As reflection from the ground connection layer does not occur, distortion of a pattern as often shown in cases based on the prior art does not occur.

(k) A groove 13 for a connection layer is formed by etching the inter-layer insulating SiO₂ film ②11 (Refer to 14K). Then, a connection layer is formed according to the same procedure as that in forming the first Al connection layer.

As clearly understood from the above description, the following effects can be expected from this embodiment.

① Even in case of fine pattern, distortion of a pattern in the upper connection layer can be prevented.

② A completely planarized Al multi-layered connection layer can be formed without spoiling planarization of the connection layer.

③ When depositing a reflection preventing film, a various methods can be selected according to the necessity, so that a freedom in the process is very high.

Embodiment 10

An antireflection film is deposited on the entire surface of a substrate, and then the film is removed by means of etching to be left only in a portion corresponding to a connection layer. Description is made below for this process with reference to FIG. 15A through FIG. 15F.

The processes (a) to (e) are the same as those in Embodiment 9 above (Refer to FIG. 14B through FIG. 14E for explanation of Embodiment 9).

Figure 15A:
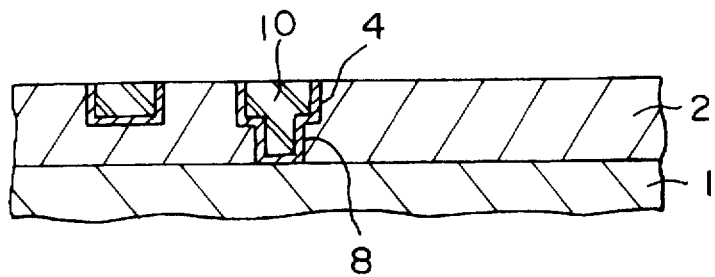
FIG. 15A is a cross sectional view illustrating a process sequence (1) in Embodiment 10.

(f) Then, an Al film 10 is planarized by polishing (Refer to FIG. 15A).

Figure 15B:
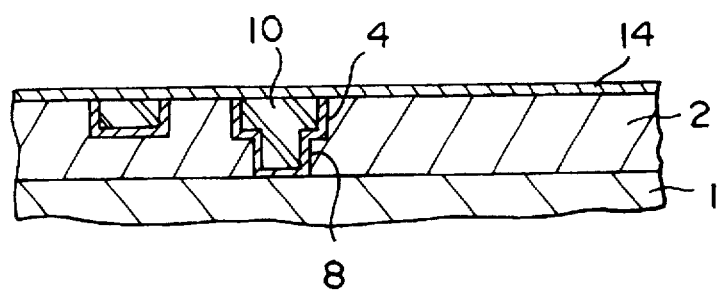
FIG. 15B is a cross sectional view illustrating a process sequence (2) in Embodiment 10.

(g) A TiON film 14 is deposited as an antireflection film by means of sputtering (Refer to FIG. 15B). The conditions are as follows.

| Conditions | Gas Ar/N₂ = | 40/70 SCCM |
|---|---|---|
| | Gas pressure | 0.5 Pa |
| | Wafer heated to | 150° C. |
| | Target power | 5 kW |
| | Ti film thickness | 30 nm |

Figure 15C:
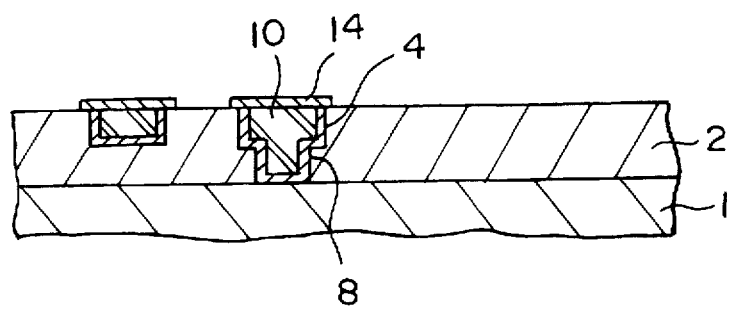
FIG. 15C is a cross sectional view illustrating a process sequence (3) in Embodiment 10.

(h) The TiON film is removed from the area other than a portion corresponding to a connection layer by means of reactive ion etching. With this operation, the construction as shown in FIG. 15C is obtained. The conditions are as follows.

| Conditions | Gas BCl₃/Cl₂ = | 60/90 SCCM |
|---|---|---|
| | Pressure | 2 Pa |
| | Micro wave power | 1000 W |
| | RF power | 50 W |

Figure 15D:
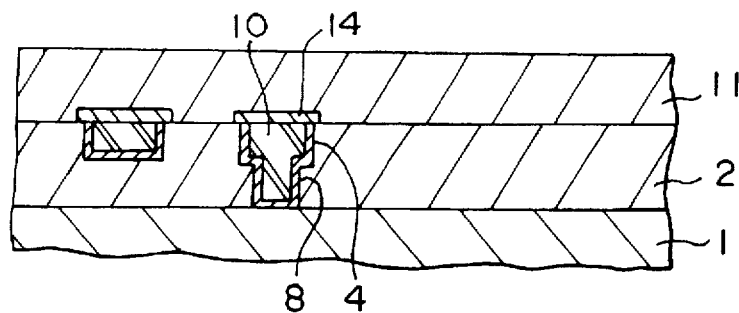
FIG. 15D is a cross sectional view illustrating a process sequence (4) in Embodiment 10.
Figure 15E:
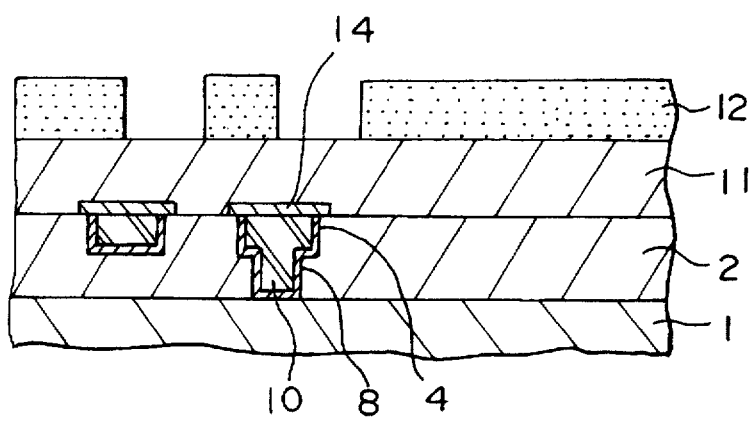
FIG. 15E is a cross sectional view illustrating a process sequence (5) in Embodiment 10.
Figure 15F:
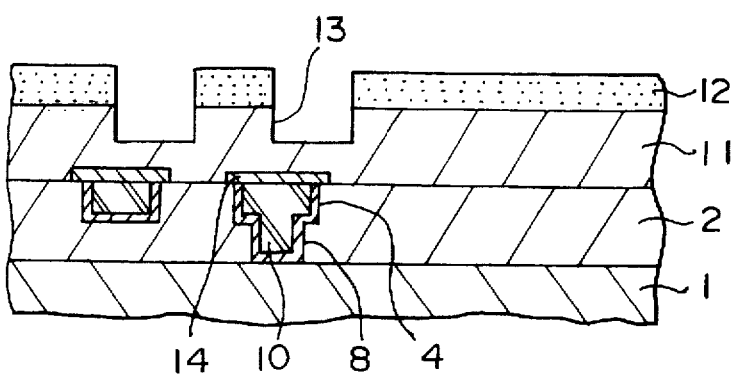
FIG. 15F is a cross sectional view illustrating a process sequence (6) in Embodiment 10.

(i) An SiO₂ film ② 11 is deposited as an inter-layer insulating film (Refer to FIG. 15D). The subsequent processes are the same as those in Embodiment 1, and the construction as shown in FIG. 15E and FIG. 15F is obtained.

Also in the present embodiment, the same effects as those in Embodiment 9 are obtained.

Embodiment 11

In this embodiment, an non-conductive antireflection film is deposited on the entire surface of a substrate, and the film is left there as it is. Description is made for this embodiment with reference to FIG. 16A through FIG. 16E.

The processes from (a) to (e) are the same as those in Embodiment 9 (Refer to FIG. 14B through FIG. 14E for explanation of Embodiment 9).

Figure 16A:
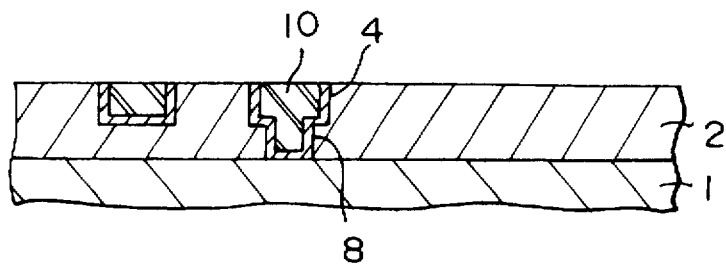
FIG. 16A is a cross sectional view illustrating a process sequence (1) in Embodiment 11.
Figure 16B:
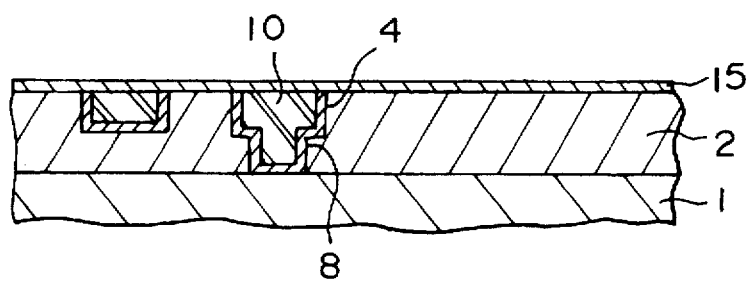
FIG. 16B is a cross sectional view illustrating a process sequence (2) in Embodiment 11.

(f) The Al film 10 is planarized by polishing (Refer to FIG. 16B).

Figure 16C:
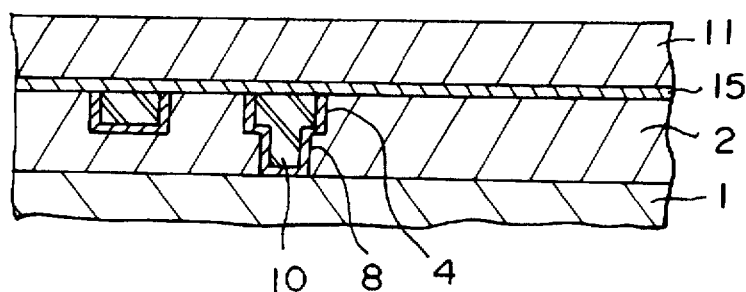
FIG. 16C is a cross sectional view illustrating a process sequence (3) in Embodiment 11.

(g) An SiO film 15 is deposited by means of CVD method (Refer to FIG. 16C). The conditions are as follows.

| Conditions | |
|---|---|
| $SiH_4/N_2O$ | = 50/50 SCCM |
| Gas pressure | 330 Pa |
| Wafer heated to | 400° C. |
| RF power | 200 W |

Figure 16D:
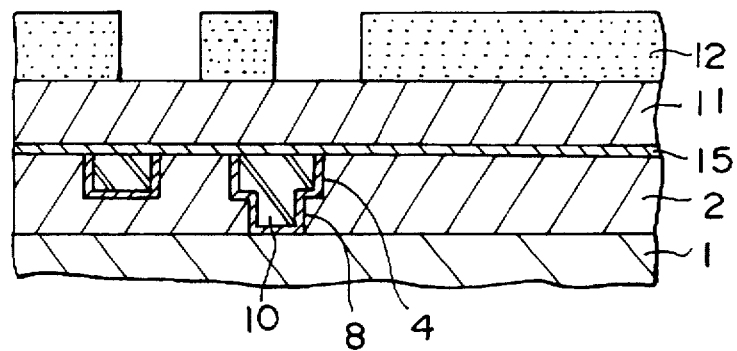
FIG. 16D is a cross sectional view illustrating a process sequence (4) in Embodiment 11.
Figure 16E:
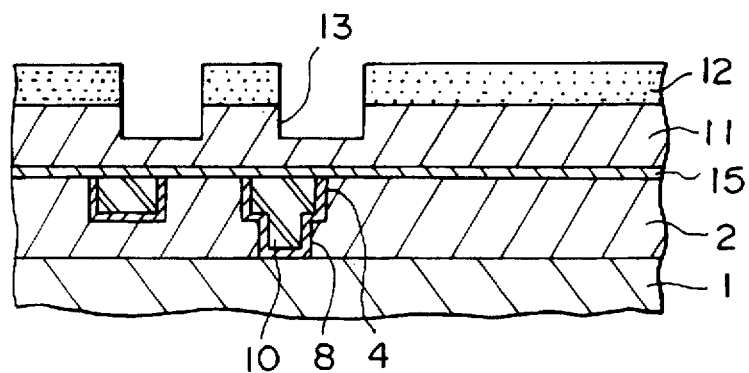
FIG. 16E is a cross sectional view illustrating a process sequence (5) in Embodiment 11.

(h) An $SiO_2$ film ② 11 is deposited as an inter-layer insulating film (Refer to FIG. 16C). The subsequent processes are the same as those in Embodiment 9, and the construction as shown in FIG. 16D and FIG. 16E is obtained.

Also in this embodiment, the same effects as those in Embodiments 9 and 10 can be obtained.

Embodiment 12

In this embodiment, a connection layer is formed according to the process sequence as described below.

Figure 17A:
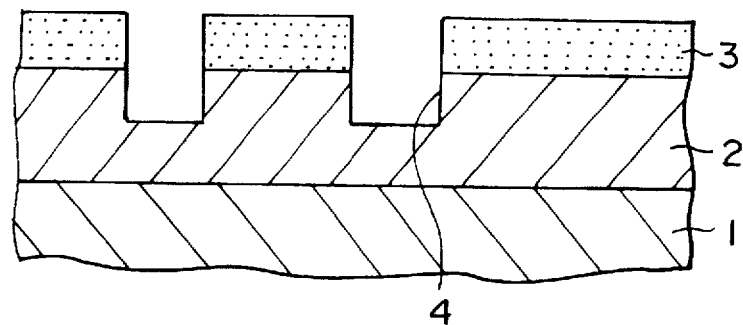
FIG. 17A is a cross sectional view illustrating a process sequence (1) in Embodiment 12.

(a) A groove 4 corresponding to a connection layer pattern is formed in the inter-layer insulating $SiO_2$ film 2 by means of lithography and dry etching (Refer to FIG. 17A). The conditions for dry etching are as follows.

| Conditions | |
|---|---|
| Gas $C_4F_8$ | = 50 SCCM |
| Gas pressure | 2 Pa |
| RF power | 1200 W |

Figure 17B:
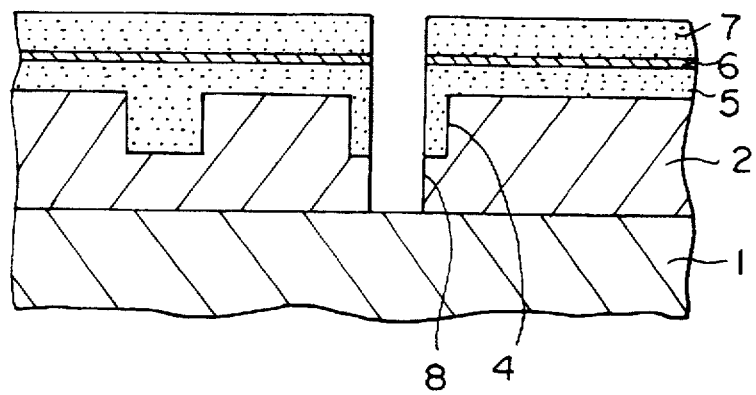
FIG. 17B is a cross sectional view illustrating a process sequence (2) in Embodiment 12.

(b) After the resist is removed, a lower resist 5 and an upper resist 7 are formed with an SOG film held therebetween to form a 3-layered resist, and patterning to make a connection hole is carried out by means of lithography. Then, a contact hole 8 (connection hole) is formed by means of dry etching (Refer to FIG. 17B).

(c) After the resist is removed, a material for connection layer is deposited. Such methods as polishing, etch back on the entire surface of a substrate by means of dry etching, or deposition of the material only in the groove 4 and the hole 8 are available for this process, and the following description assumes a case where polishing is employed.

Figure 17C:
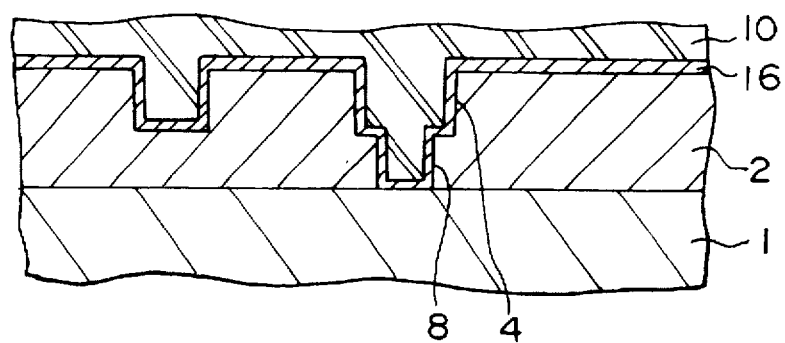
FIG. 17C is a cross sectional view illustrating a process sequence (3) in Embodiment 12.

A Ti+TiN (annealed)+Ti film is deposited as a barrier metal 16 by means of sputtering. Then, after an upper Ti film is deposited, Al or Al alloy 10 is deposited continuously in vacuum under a high temperature. With this operation, inside of the groove 4 and the connection hole 8 is filled with the Al-based material 10 and the barrier metal 16 (Refer to FIG. 17C). The conditions for deposition are as follows.

Conditions for depositing an Ti film

| Gas Ar | = 100 SCCM |
|---|---|
| Pressure | 0.5 Pa |
| Wafer heated to | 150° C. |
| Film thickness | 30 nm |

Conditions for depositing a TiN film

| Gas $Ar/N_2$ | = 30/80 SCCM |
|---|---|
| Pressure | 0.5 Pa |
| Wafer heated to | 150° C. |
| Film thickness | 70 nm |

Conditions for annealing TiN
Under 500° C. for 30 minutes
in $N_2$ and 20% $O_2$
Conditions for depositing the upper Ti film

| Gas Ar | = 100 SCCM |
|---|---|
| Pressure | 0.5 Pa |
| Wafer heated to | 150° C. |
| Film thickness | 60 nm |

Conditions for depositing the Al—20% Si film

| Gas Ar | = 100 SCCM |
|---|---|
| Pressure | 0.5 Pa |
| Wafer heated to | 500° C. |
| Film thickness | 500 nm |

Figure 17D:
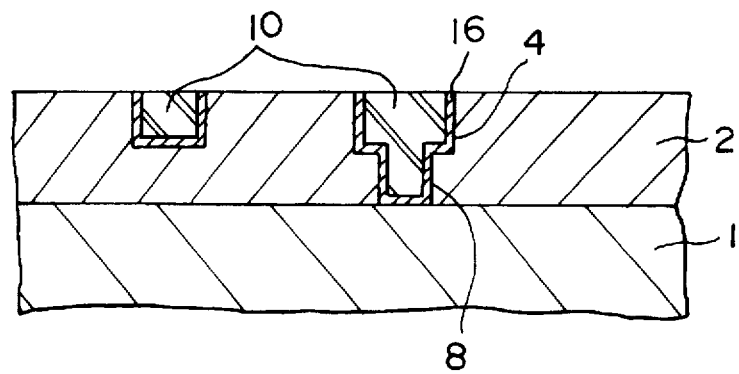
FIG. 17D is a cross sectional view illustrating a process sequence (4) in Embodiment 12.

(d) The Al-based material and the barrier metal 16 in the area other than a portion corresponding to a connection layer are polished and planarized by means of polishing (Refer to FIG. 17D). In this process, a 2-shaft rotary polishing machine used for polishing an Si substrate is used. Also, for polishing the Al-based material 10, any chemical is not used, and for instance a 1% aqueous solution of KOH is used as an etching liquid.

Figure 17E:
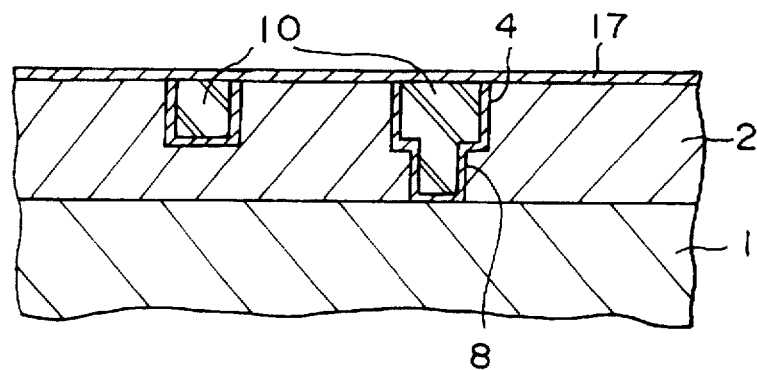
FIG. 17E is a cross sectional view illustrating a process sequence (5) in Embodiment 12.

(e) An $SiO_2$ or $SiN_2$ or $SiO_xN_y$ film is deposited as an antireflection film 17 under a temperature of 150° C. by means of FCR-CVD method (Refer to FIG. 17E). An example of conditions for film deposition using $SiN_y$, is shown below.

| Conditions | |
|---|---|
| Gas $SiH_4/N_2O$ | = 100 SCCM |
| Pressure | 0.1 Pa |
| Micro wave | 800 W |
| Wafer heated to: R. T. | –150° C. |

As for reliability of an Al-based connection layer, as the rules concerning dimensions of a substrate have become more complicated, such troubles as Al voids generated due to stress migration or short circuit between connection layers due to generation of hillock have become increasingly difficult to treat, and it is desired to deposit a film under as low a temperature as possible (for instance, under 150° C. or below) when depositing a film to cover the Al connection layer, and in the present embodiment this requirement is satisfied.

Figure 20:
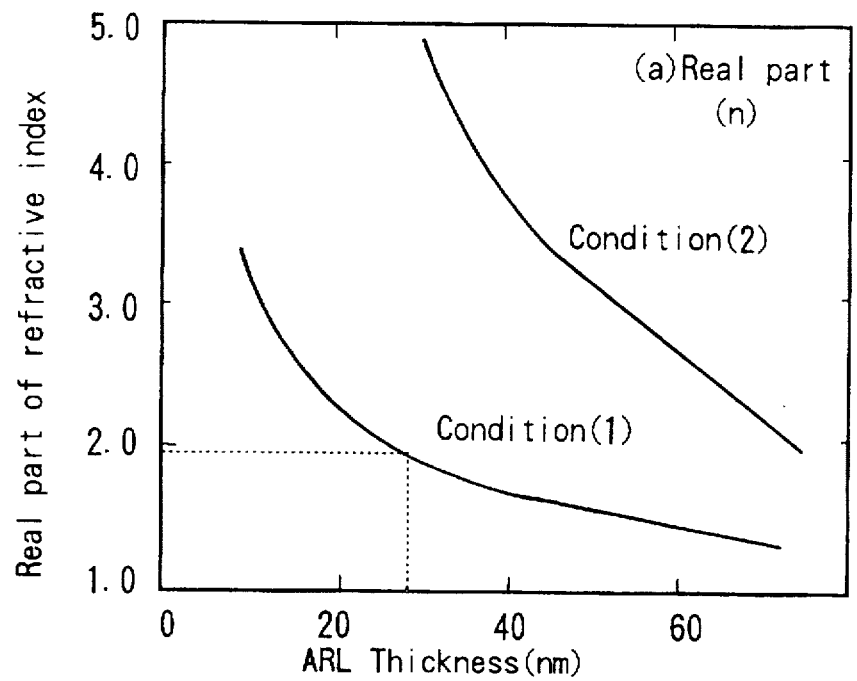
FIG. 20 is a drawing illustrating a relation between a thickness of reflection preventing film (ARL) and the optical constant (n)
Figure 21:
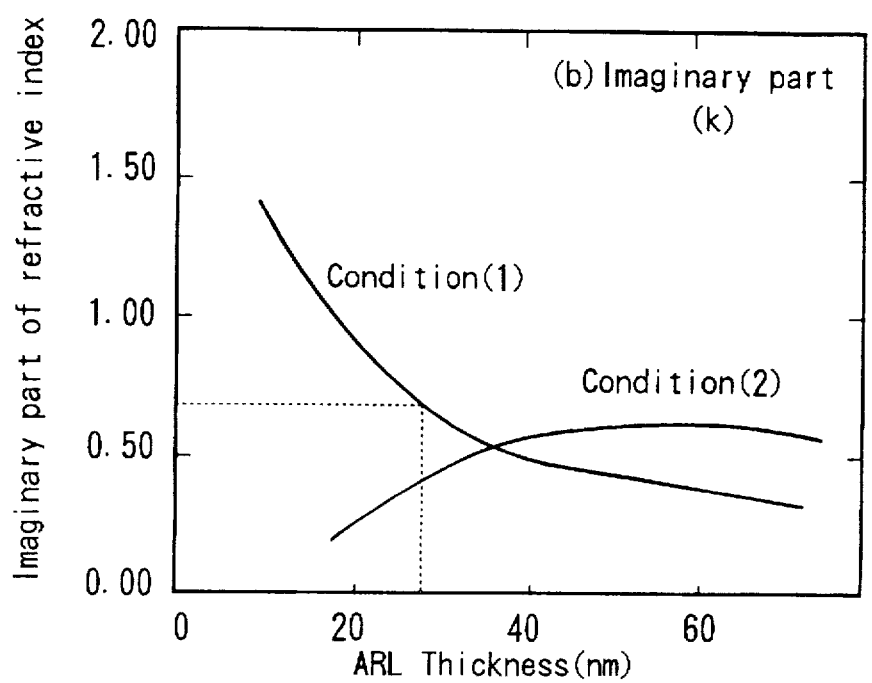
FIG. 21 is a drawing illustrating a relation between a thickness of reflection preventing film (ARL) and the optical constant (k)
Figure 22:
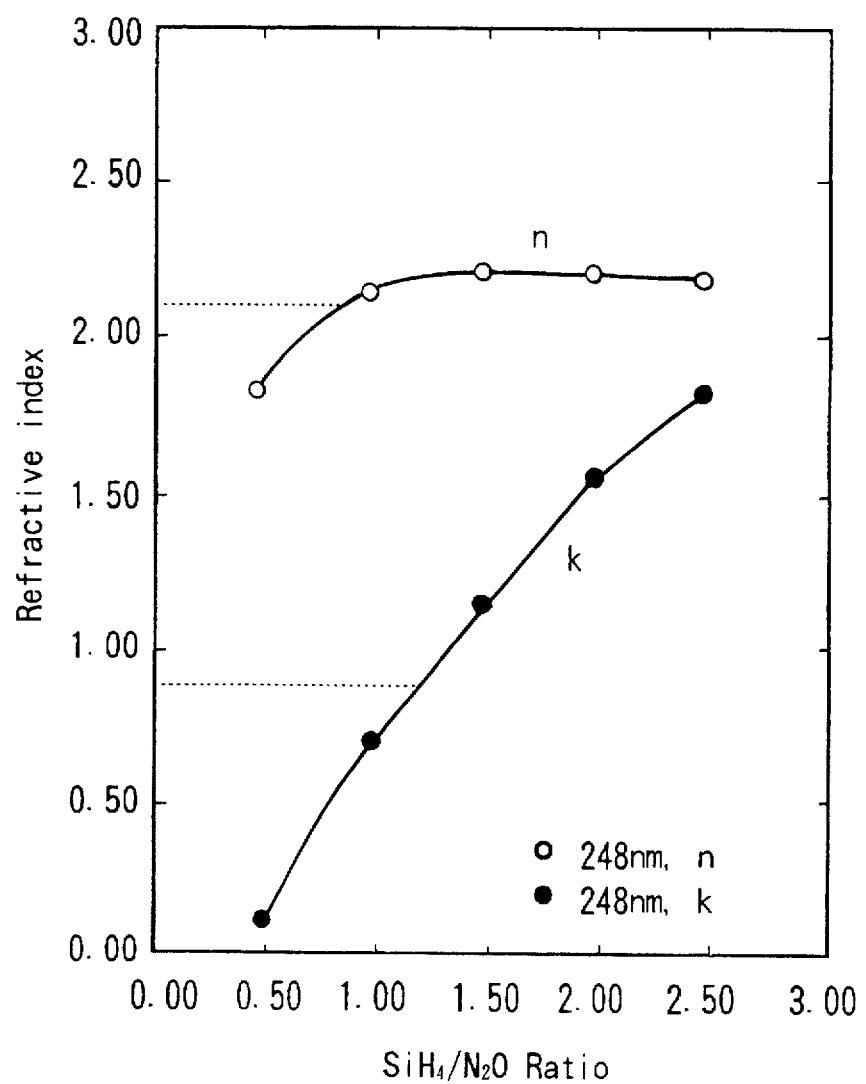
FIG. 22 is a drawing illustrating control over the optical constant assuming a gas flow ratio as a parameter.

As for the requirements for CVD described above such as a flow rate ratio of $SiH_4$ vs $N_2O$ and a film thickness, the combination of optimal values of each parameters may vary according to a wave length employed in actual film deposition, and for instance if a KrF excimer laser (with a wave length of 248 nm) is used, the combination of parameters concerning an antireflection film such as optical constants (n,k) of 2.09 and 0.87 and a film thickness of 24 nm is preferably available, as shown in FIG. 20 and FIG. 21. This type of film can be obtained when the flow rate ratio between $SiH_4$ and $N_2O$ is around 1:1. To deposit a $SiO_x$ film, the combination of gasses changes to $SiH_4+C_2H_4$, and to deposit an $SiO_xN_y$ film, the combination changes to $SiH_4/C_2H_4 +N_2O$. In these cases, a specific flow rate of each gas (n,k) is specified to the optimal value respectively.

Figure 17F:
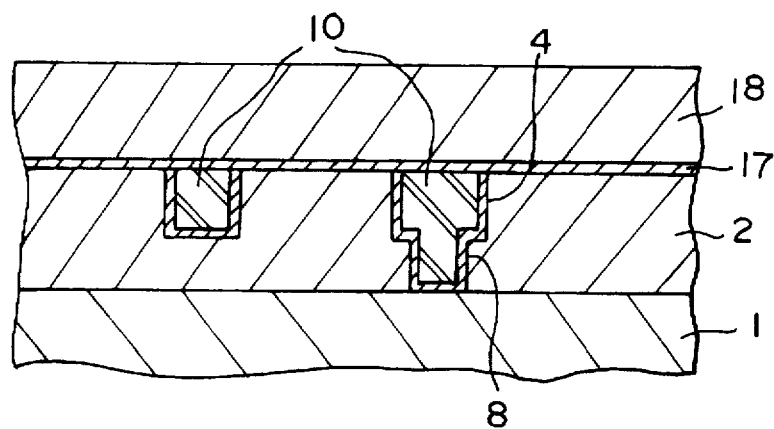
FIG. 17F is a cross sectional view illustrating a process sequence (6) in Embodiment 12.

(f) Then, a $CVD-SiO_2$ film 18 is deposited as an interlayer insulating film over the film deposited in step (e) (Refer to FIG. 17F). In this process, even if the film is heated up to around 400° C., any hillock is not generated in Al due to effect by the antireflection film below it. The conditions for depositing a $CVD-SiO_2$ film are as follows.

| Conditions | |
|---|---|
| Gas: $SiH_4/O_2/N_2$ | = 250/250/100 SCCM |
| Temperature | 410° C. |
| Pressure | 13.3 Pa |
| Film thickness | 800 nm |

Figure 17G:
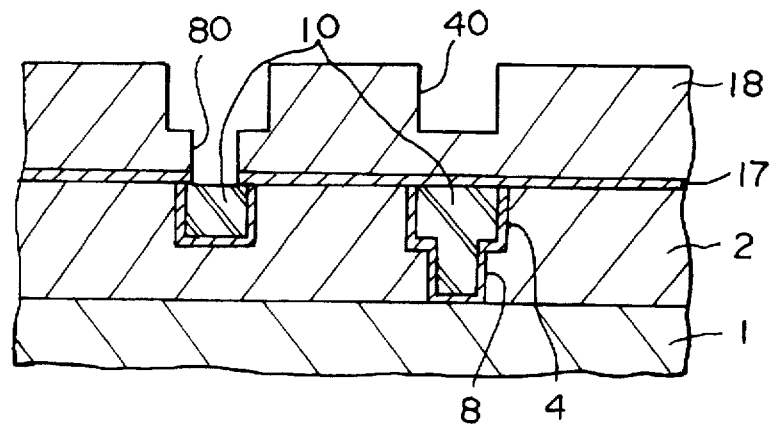
FIG. 17G is a cross sectional view illustrating a process sequence (7) in Embodiment 12.

(g) A groove 40 corresponding to the connection layer described above is provided and also a contact hole (connection hole) 80 is opened by means of lithography and dry etching. In this process, because no effect is caused due to reflection by the base, excellent patterns can be provided (Refer to FIG. 17G). The conditions for dry etching may be the same as those in the previous process (a).

Embodiment 13

The steps (a) to (c) are carried out according to the same procedure as in Embodiment 12 above. Then the process (d') as described below is carried out.

Figure 18:
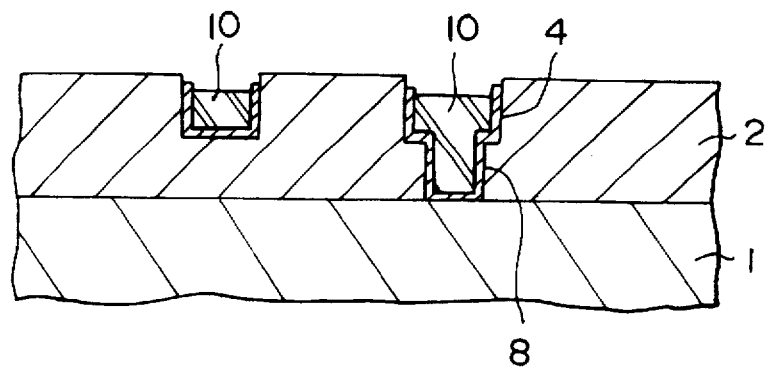
FIG. 18 is a drawing illustrating a process sequence in Embodiment 13.

(d') Al and barrier metal deposited in the area other than a portion corresponding to a connection layer are removed by carrying out etch back in the entire surface of the substrate by means of dry etching (Refer to FIG. 18). In this process, over-etching is required, a top face of the connection layer is concaved from a top surface of the insulating film, and it is difficult to carry out planarization so completely as by polishing, but this process is very simple, and this method may advantageously be employed in certain devices. The conditions for etch back of the entire surface of an Al-based connection layer or the barrier metal are as follows.

| Conditions | Gas $BCl_3/Cl_2$ | = 40/60 SCCM |
|---|---|---|
| | Pressure | 1.3 Pa |
| | RF bias | 50 W |

The steps (c) to (g) are carried out according to the same procedure as in Embodiment 12.

Embodiment 14

Steps (a) and (b) are carried out according to the same procedure as in Embodiment 1. Then the step (c') is carried out.

Figure 19:
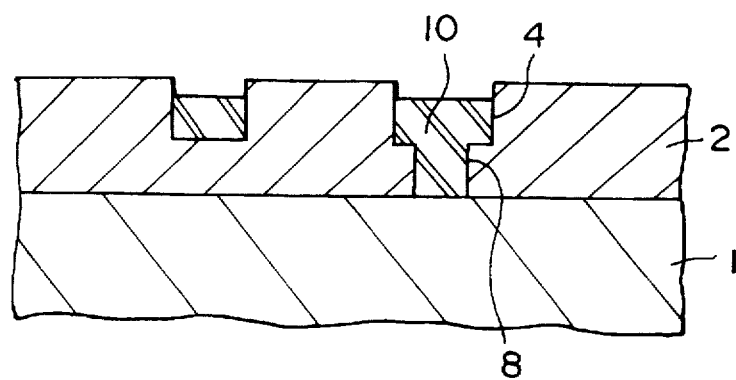
FIG. 19 is a drawing illustrating a process sequence in Embodiment 14.

(c') One of the technologies being actively investigated in recent years is a technology of depositing an Al-based material first, then heating and flowing it into a groove to form a connection layer by means of self alignment and without carrying out etch back later. The conditions required for using this technology are as shown below (Refer to FIG. 19).

Conditions for depositing an Al-1% Si film by sputtering

| Gas | Ar-100 SCCM |
|---|---|
| Pressure | 0.5 Pa |
| Wafer heated to | 150° C.–500° C. |
| Film thickness | 300–500 nm |

Conditions for heating reflow after film deposition

| Wafer heated to | 500–580° C. |
|---|---|
| Time for heating | 30 min. or below in Ar atmosphere. |

It should be noted that the processing is continuously carried in vacuum after the Al film is deposited.

The step (d) above is not required, and the steps (e) to (g) are carried out according to the same procedure as in Embodiment 12. However, this method is effective when a barrier metal is not used, and if such a layer as a TiN layer is provided, such post processing as etch back is required later.

With the method of forming a connection layer according to the present invention, when forming a connection layer by filling an Al-based material in a groove, complete planarization can be achieved on the entire surface of the substrate.

What is claimed is:

1. A method of forming multi-layer connection layers on a semiconductor integrated circuit, comprising the steps of:
   depositing a first interlayer insulating film on a substrate;
   forming a concave section extending partially through the first interlayer insulating film by etching the first interlayer insulating film;
   forming a three-layer resist over the concave section and first interlayer insulating film;
   forming a contact hole through the concave section and through the first interlayer insulating film to the substrate by a plurality of etching operations, the contact hole being narrower than the concave section;
   depositing a unitary lower metal film layer on the concave section, the contact hole, the substrate and the first interlayer insulating film;
   depositing a lower connection layer on the lower metal film to fill up the concave section and contact hole and to extend laterally above a surface of the first interlayer insulating film;
   polishing a surface of the lower connection layer to planarize a surface of the deposited connection layer and the first interlayer insulating film;
   depositing an antireflection film on the surface of the deposited connection layer and the first interlayer insulating film; and
   forming an upper wiring layer by depositing a second interlayer insulating film.

2. A method of forming multi-layer connection layers on a semiconductor integrated circuit, comprising the steps of:
   depositing a first interlayer insulating film on a substrate;
   forming a concave section extending partially through the first interlayer insulating film by etching the first interlayer insulating film;

forming a three-layer resist over the concave section and first interlayer insulating film;

forming a contact hole through the concave section and through the first interlayer insulating film to the substrate by a plurality of etching operations the contact hole being narrower than the concave section;

depositing a unitary lower metal film layer on the concave section the contact hole. the substrate and the first interlayer insulating film;

depositing a lower connection layer on the first interlayer insulating film to fill up the concave section and to extend laterally above a surface of the first interlayer insulating film;

polishing a surface of the lower connection layer to planarize a surface of the deposited connection layer and the first interlayer insulating film until the surface of the deposited connection layer is lower than the surface of the first interlayer insulating film;

depositing an antireflection film on the surface of the deposited connection layer and the first interlayer insulating film after polishing;

removing the antireflection film from an area other than a portion corresponding to the wiring layer by polishing for planarization; and forming an upper wiring layer with a second interlayer insulating film.

3. A method as claimed in claim 2. wherein said antireflection film comprises a conductive material.

4. A method as claimed in claim 3. wherein said conductive material is an alloy including titanium.

5. A method of forming multi-layer connection layers on a semiconductor integrated circuit, comprising the steps of:

depositing a first interlayer insulating film on a substrate;

forming a concave section extending partially through the first interlayer insulating film by etching the first interlayer insulating film;

forming a three-layer resist over the concave section and first interlayer insulating film;

forming a contact hole through the concave section and through the first interlayer insulating film to the substrate by a plurality of etching operations. the contact hole being narrower than the concave section;

depositing a unitary lower metal film layer on the concave section. the contact hole. the substrate and the first interlayer insulating film;

depositing a lower connection layer on the first interlayer insulating film to fill up the concave section extending partially through the first interlayer insulating film and to extend laterally above a surface of the first interlayer insulating film;

polishing a surface of the lower connection layer to planarize a surface of the deposited connection layer and the first interlayer insulating film;

depositing an antireflection film on the surface of the deposited connection layer and the first interlayer insulating film after polishing;

removing the antireflection film from the area other than a portion corresponding to the connection layer by etching process; and forming an upper wiring layer by a second interlayer insulating film.

6. A method as claimed in claim 5. wherein said antireflection film comprises a conductive material.

7. A method as claimed in claim 5. wherein said conductive material is an alloy including titanium.

8. A method of forming multi-layer connection layers on a semiconductor integrated circuit, comprising the steps of:

depositing a first interlayer insulating film on a substrate;

forming a concave section extending partially through the first interlayer insulating film by etching the first interlayer insulating film;

forming a three-layer resist over the concave section and first interlayer insulating film;

forming a contact hole through the concave section and through the first interlayer insulating film to the substrate by a plurality of etching operations. the contact hole being narrower than the concave section;

depositing a unitary lower metal film layer on the concave section the contact hole. the substrate and the first interlayer insulating film;

depositing a lower connection layer on the first interlayer insulating film to fill up the concave section and to extend laterally above a surface of the first interlayer insulating film;

polishing a surface of the lower connection layer to planarize a surface of the deposited connection layer and the first interlayer insulating film;

depositing an antireflection film on the surface of the deposited connection layer and the first interlayer insulating film after polishing; and forming an upper wiring layer with the antireflection film and a second interlayer insulating film.

9. A method as claimed in claim 8. wherein said antireflection film consists of insulating material.

10. A method as claimed in claim 9. wherein said insulating material is selected from the group consisting of $SiO_x$, $SiN_y$, and $SiO_xN_y$.

* * * * *